US008212328B2

(12) United States Patent
Pyo

(10) Patent No.: US 8,212,328 B2
(45) Date of Patent: Jul. 3, 2012

(54) BACKSIDE ILLUMINATED IMAGE SENSOR

(75) Inventor: Sung-Gyu Pyo, Chungcheongbuk-do (KR)

(73) Assignee: Intellectual Ventures II LLC, Wilmington, DE (US)

( * ) Notice: Subject to any disclaimer, the term of this patent is extended or adjusted under 35 U.S.C. 154(b) by 418 days.

(21) Appl. No.: 12/289,901

(22) Filed: Nov. 6, 2008

(65) Prior Publication Data

US 2009/0146148 A1    Jun. 11, 2009

(30) Foreign Application Priority Data

Dec. 5, 2007  (KR) .................. 10-2007-0125506
Dec. 5, 2007  (KR) .................. 10-2007-0125507
Apr. 18, 2008 (KR) .................. 10-2008-0036203

(51) Int. Cl.
*H01L 31/00* (2006.01)

(52) U.S. Cl. .................. 257/447; 257/228; 257/460

(58) Field of Classification Search .......... 257/228, 257/292, 294, 447, 460, 797, E33.068
See application file for complete search history.

(56) References Cited

U.S. PATENT DOCUMENTS

| | | | |
|---|---|---|---|
| 5,429,036 A | 7/1995 | Latos | |
| 6,821,809 B2 * | 11/2004 | Abe et al. .................. | 438/65 |
| 7,101,726 B2 | 9/2006 | Yamamoto et al. .......... | 438/69 |
| 7,468,289 B2 | 12/2008 | Maruyama et al. .......... | 438/65 |
| 2005/0104148 A1 * | 5/2005 | Yamamoto et al. .......... | 257/432 |
| 2005/0139828 A1 | 6/2005 | Maruyama et al. .......... | 257/59 |
| 2006/0249803 A1 | 11/2006 | Yamamoto et al. .......... | 257/432 |
| 2006/0281215 A1 | 12/2006 | Maruyama et al. .......... | 438/57 |
| 2009/0011534 A1 | 1/2009 | Yamamoto et al. .......... | 438/69 |
| 2010/0096718 A1 * | 4/2010 | Hynecek et al. .......... | 257/460 |

FOREIGN PATENT DOCUMENTS

| | | |
|---|---|---|
| KR | 10-2005-0042729 A | 5/2005 |
| KR | 10-2005-0047481 A | 5/2005 |
| KR | 2005-47481 | 5/2005 |
| KR | 20050042729 | 5/2005 |
| KR | 10-0533166 | 12/2005 |
| KR | 20060006340 | 1/2006 |
| KR | 2006-96924 | 9/2006 |
| KR | 10-2008-0013566 | 2/2008 |
| KR | 2008-13566 | 2/2008 |

OTHER PUBLICATIONS

Korean Office Action, dated Jan. 20, 2010. (English translation provided).

* cited by examiner

*Primary Examiner* — Hung Vu
(74) *Attorney, Agent, or Firm* — McAndrews, Held & Malloy Ltd.

(57) ABSTRACT

A backside illuminated image sensor includes a light receiving element disposed in a first substrate, an interlayer insulation layer disposed on the first substrate having the light receiving element, an align key spaced apart from the light receiving element and passing through the interlayer insulation layer and the first substrate, a plurality of interconnection layers disposed on the interlayer insulation layer in a multi-layered structure, wherein the backside of the lowermost interconnection layer is connected to the align key, a passivation layer covering the interconnection layers, a pad locally disposed on the backside of the first substrate and connected to the backside of the align key, a light anti-scattering layer disposed on the backside of the substrate having the pad, and a color filter and a microlens disposed on the light anti-scattering layer to face the light receiving element.

22 Claims, 22 Drawing Sheets

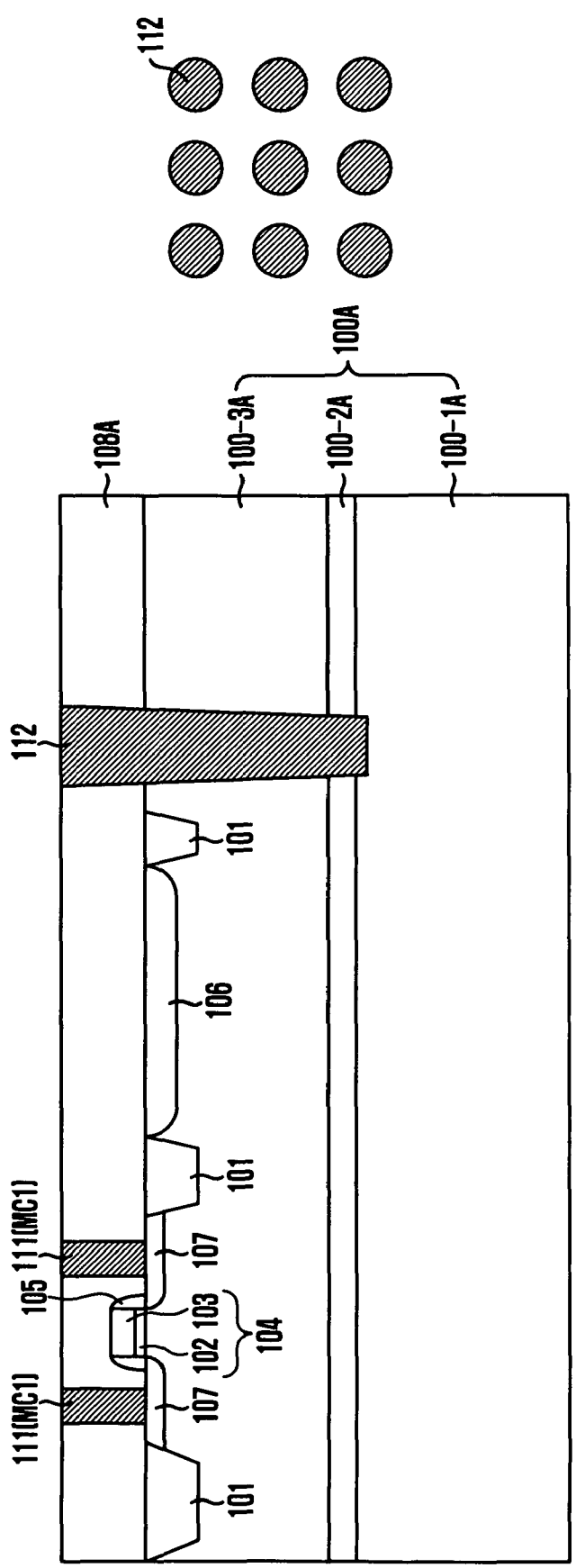

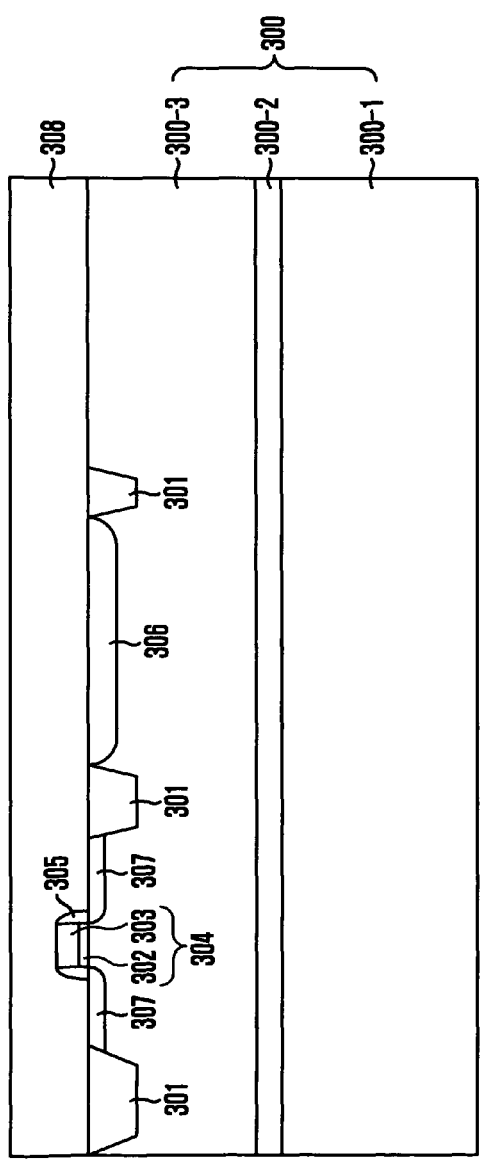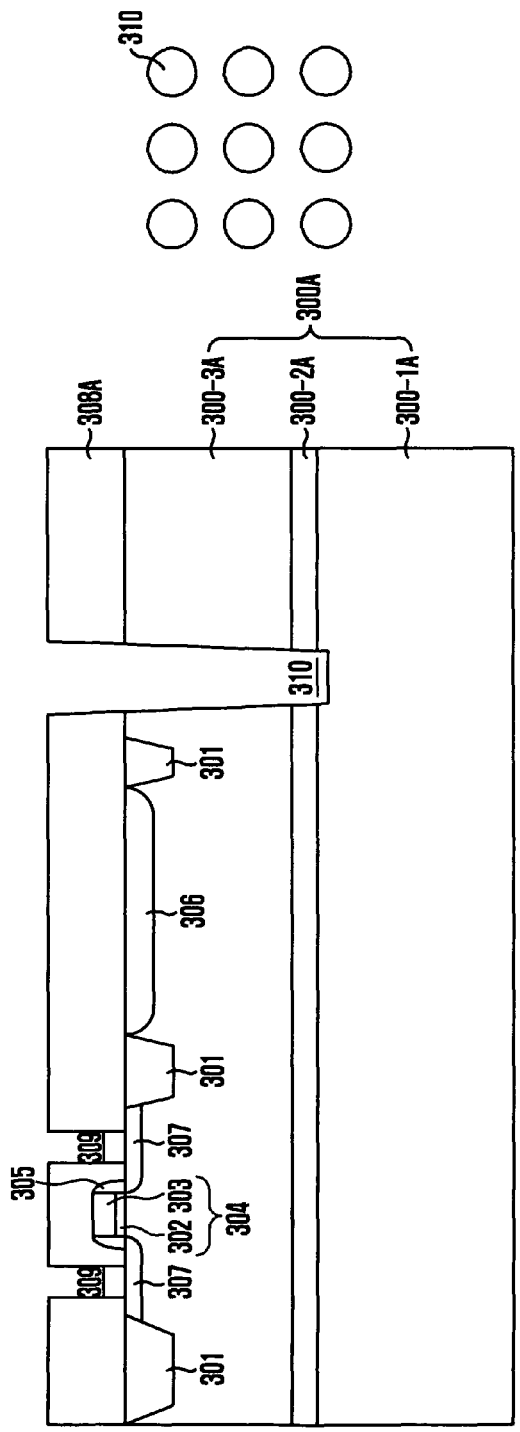
FIG. 4A
FIG. 4B

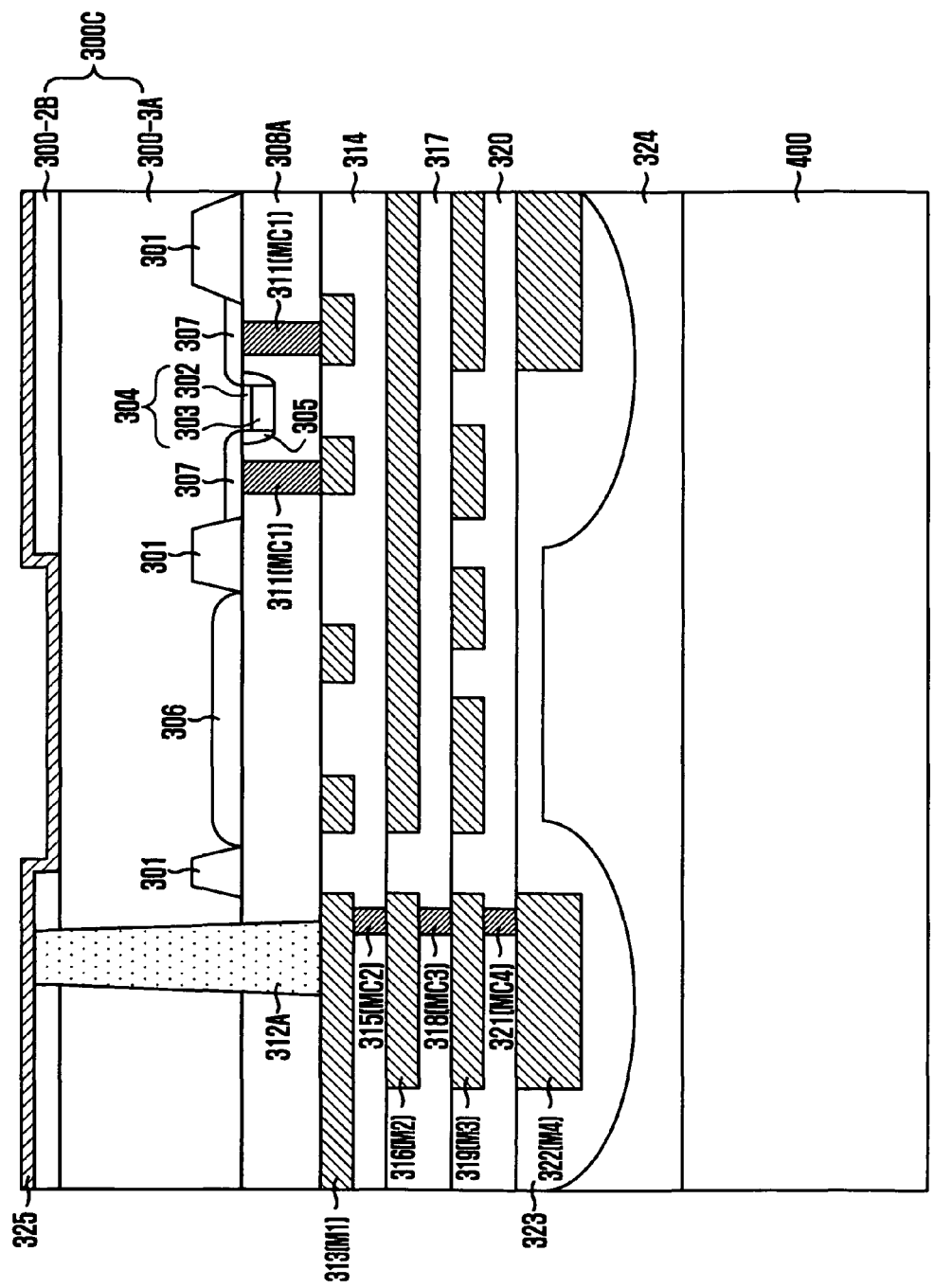

BACKSIDE ILLUMINATED IMAGE SENSOR

CROSS-REFERENCE TO RELATED APPLICATIONS

The present invention claims priority of Korean patent application numbers 10-2007-0125506, 10-2007-00125507, and 10-2008-0036203, filed on Dec. 5, 2007, Dec. 5, 2007, and Apr. 18, 2008, respectively, which are incorporated by reference in their entirety.

BACKGROUND OF THE INVENTION

The present invention relates to an image sensor, and more particularly, to a backside illuminated image sensor.

In a complementary metal oxide semiconductor (CMOS) image sensor, a light receiving element, a digital control block, and a peripheral circuit such as an analog-to-digital converter are arranged at a finite area within a chip. Thus, an area ratio of a pixel array per a chip area is limited to about 40%. Furthermore, a pixel size is greatly reduced for implementation of high quality images. Accordingly, an amount of light that one light receiving element can collect is reduced and noise is increased, causing various problems such as image loss.

SUMMARY OF THE INVENTION

Embodiments of the present invention are directed to providing a backside illuminated image sensor, in which light is illuminated from the backside of a wafer.

In accordance with a first aspect of the present invention, there is provided a backside illuminated image sensor including a light receiving element disposed in a first substrate, an interlayer insulation layer disposed on the first substrate having the light receiving element, an align key spaced apart from the light receiving element and passing through the interlayer insulation layer and the first substrate, a plurality of interconnection layers disposed on the interlayer insulation layer in a multi-layered structure, wherein the backside of the lowermost interconnection layer is connected to the align key, a passivation layer covering the interconnection layers, a pad locally disposed on the backside of the first substrate and connected to the backside of the align key, a light anti-scattering layer disposed on the backside of the substrate having the pad, and a color filter and a microlens disposed on the light anti-scattering layer to face the light receiving element.

In accordance with a second aspect of the present invention, there is provided a backside illuminated image sensor including a light receiving element disposed in a first substrate, an interlayer insulation layer disposed on the first substrate having the light receiving element, an align key spaced apart from the light receiving element and passing through the interlayer insulation layer and the first substrate, a plurality of interconnection layers disposed on the interlayer insulation layer in a multi-layered structure, wherein the backside of the lowermost interconnection layer is exposed, a passivation layer covering the interconnection layers, a light anti-scattering layer disposed on the backside of the substrate having the pad, and a color filter and a microlens disposed on the light anti-scattering layer to face the light receiving element.

BRIEF DESCRIPTION OF THE DRAWINGS

FIGS. 2A to 2K illustrate a method for fabricating a backside illuminated image sensor in accordance with a first embodiment of the present invention.

FIGS. 4A to 4K illustrate a method for fabricating a backside illuminated image sensor in accordance with a second embodiment of the present invention.

DESCRIPTION OF SPECIFIC EMBODIMENTS

Figure 1:
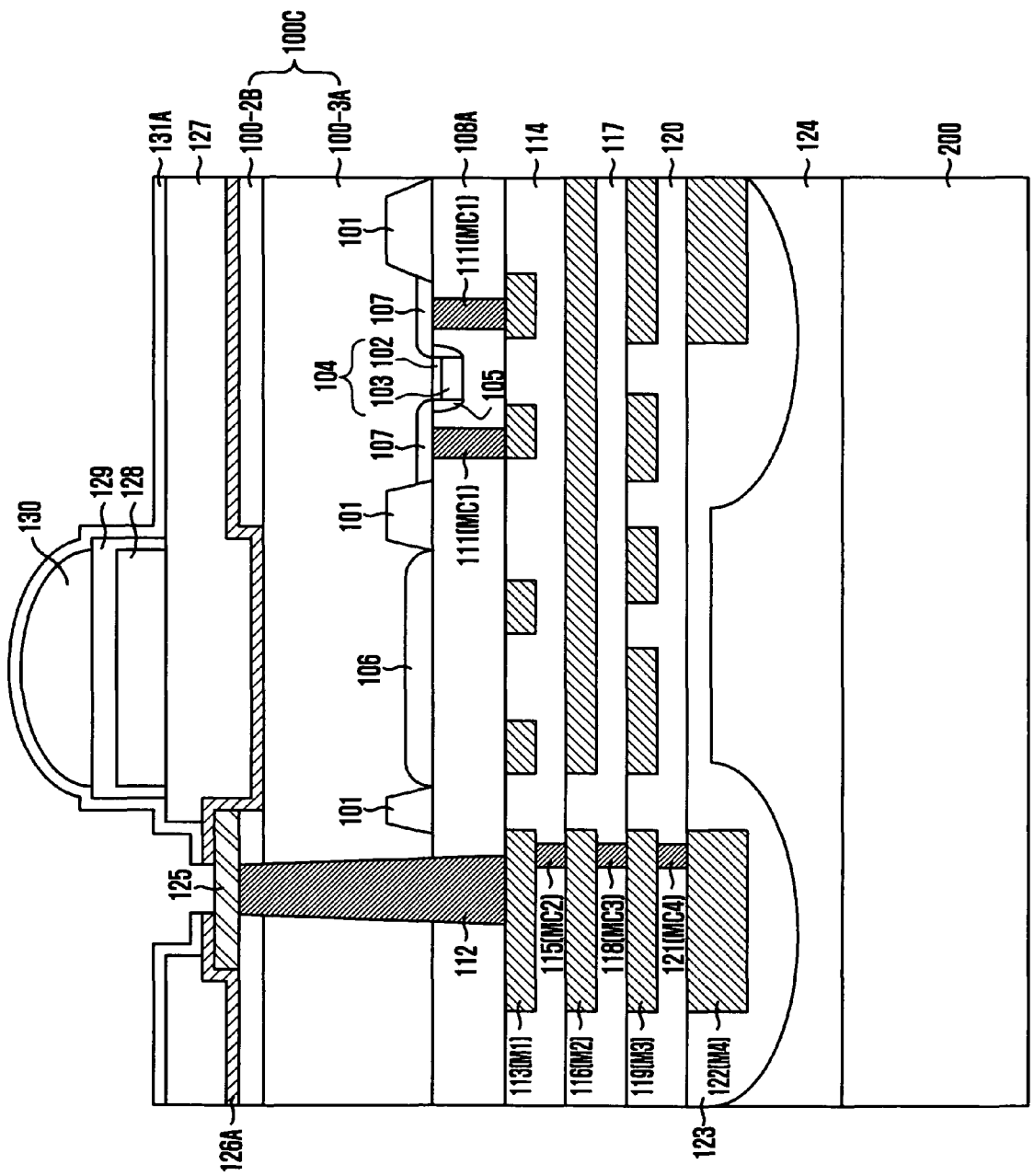
FIG. 1 illustrates a cross-sectional view of a backside illuminated image sensor in accordance with a first embodiment of the present invention.

Embodiments of the present invention relate to a backside illuminated image sensor in accordance with the present invention. Referring to the drawings, the illustrated thickness of layers and regions are exaggerated to facilitate explanation. When a first layer is referred to as being "on" a second layer or "on" a substrate, it could mean that the first layer is formed directly on the second layer or the substrate, or it could also mean that a third layer may exist between the first layer and the substrate. Furthermore, the same or like reference numerals throughout the various embodiments of the present invention represent the same or like elements in different drawings. In addition, changes to the English characters of the reference numerals of layers refer to a partial deformation of the layers by an etch process or a polishing process. In addition, a first conductivity type and a second conductivity type refer to different conductivity types, for example, p-type and n-type.

FIG. 1 illustrates a cross-sectional view of a backside illuminated image sensor in accordance with a first embodiment of the present invention. Only a photo diode and a gate electrode of a driving transistor in a unit pixel of a CMOS image sensor are illustrated in FIG. 1 for convenience.

Referring to FIG. 1, the backside illuminated image sensor in accordance with the first embodiment of the present invention has a structure in which a device wafer and a handle wafer are attached together. The device wafer is a wafer where a light receiving element such as a photodiode is formed, and the handle wafer is a wafer where peripheral circuits such as a digital block and an analog-to-digital converter are formed. In the following description, the device wafer and the handle wafer will be referred to as a first substrate and a second substrate, respectively.

The backside illuminated image sensor in accordance with the first embodiment of the present invention includes a light receiving element, for example, a photodiode 106, which is formed in a first substrate 100C, a first interlayer insulation pattern 108A formed over the first substrate 100C, an align key 112 spaced apart from the photodiode 106 and passing through the first interlayer insulation pattern 108A and the first substrate 100C, first to fourth interconnection layers 113, 116, 119 and 122 formed over the first interlayer insulation pattern 108A in a multi-layered structure, where the backside of the first interconnection layer 113 among the first to fourth interconnection layers 113, 116, 119 and 122 is connected to the align key 112, a passivation layer 124 covering the interconnection layers 113, 116, 119 and 122, a pad 125 locally formed on the backside of the first substrate 100C and connected to the backside of the align key 112, a light anti-scattering pattern 126A formed on the backside of the first substrate 100C, and a color filter 128 and a microlens 130 overlapping the photodiode 106 on the light anti-scattering pattern 126A.

The first substrate 100C and the second substrate 200 may be a bulk substrate, an epitaxial substrate, or a silicon on insulator (SOI) substrate. Considering the device characteristics, an SOI substrate where a semiconductor layer, a buried oxide layer, and a semiconductor layer are stacked is used as the first substrate 100C, and a relatively cheap bulk substrate is used as the second substrate 200.

The align key 112 is provided in plurality. The plurality of align keys 112 are connected to one pad 125. The top surface of the align key 112 is connected to the first interconnection layer 113 among the first to fourth interconnection layers 113, 116, 119 and 122, and the align key 112 transfers a signal or voltage applied from the pad 125 to the first to fourth interconnection layers 113, 116, 119 and 122. The align key 112 may be formed of a conductive material, for example, a metal or an alloy. In addition, the align key 112 may be formed in a circular, oval, or polygonal (triangular, rectangular, pentagonal, etc.) shape. There is no limitation in the number and size (width) of the align key 112.

The light anti-scattering pattern 126A may be formed in a multi-layered structure where materials having different refractive indexes are stacked. For example, the light anti-scattering layer 126A may include a stacked layer (an oxide/nitride layer or a nitride/oxide layer) of an oxide layer and a nitride layer, or a stacked layer (an oxide/SiC layer or an SiC/oxide layer) of an oxide layer and a carbon-containing layer (SiC). In this case, the oxide layer may include one layer selected from the group consisting of a borophosphosilicate Glass (BPSG) layer, a phosphosilicate glass (PSG) layer, a borosilicate glass (BSG), an un-doped silicate glass (USG) layer, a tetra ethyl ortho silicate (TEOS) layer, and a high density plasma (HDP) layer. The nitride layer may include a silicon nitride ($Si_xN_y$) layer, where x and y are natural numbers, or a silicon oxynitride ($Si_xO_yN_z$) layer, where x, y and z are natural numbers. The nitride layer may include an N—H rich nitride layer having more N—H bonds than $Si_3N_4$ which is bonded in a relatively stable state. In addition, the nitride layer or the SiC layer are formed thinly. The oxide layer may be formed to a thickness of approximately 1,000 Å to approximately 10,000 Å, and the nitride layer or the SiC layer may be formed to a thickness of approximately 100 Å to approximately 5,000 Å.

Also, the backside illuminated image sensor in accordance with the first embodiment of the present invention further includes a barrier layer (not shown) enclosing an outer wall of the align key 112. The barrier layer (not shown) may include a metal layer or an insulation layer. For example, the metal layer may include a Ti/TiN layer, and the insulation layer may include a nitride layer (e.g., a silicon nitride layer), an oxide layer (e.g., a silicon oxide layer), or a stacked layer there of (e.g., an oxide/nitride layer).

In addition, the backside illuminated image sensor in accordance with the first embodiment of the present invention further includes a plurality of transistors for transferring and amplifying an optical signal of the photodiode 106. For example, a driving transistor includes a gate electrode 104 formed between the first substrate 100C and the interlayer insulation layer 108A, and source and drain regions 107 formed in the first substrate 100C exposed on both sides of the gate electrode 104.

A method for fabricating a backside illuminated image sensor in accordance with a first embodiment of the present invention will be described below.

FIGS. 2A to 2K illustrate a method for fabricating a backside illuminated image sensor in accordance with a first embodiment of the present invention. In the following description, an SOI substrate will be exemplified.

Figure 2A:
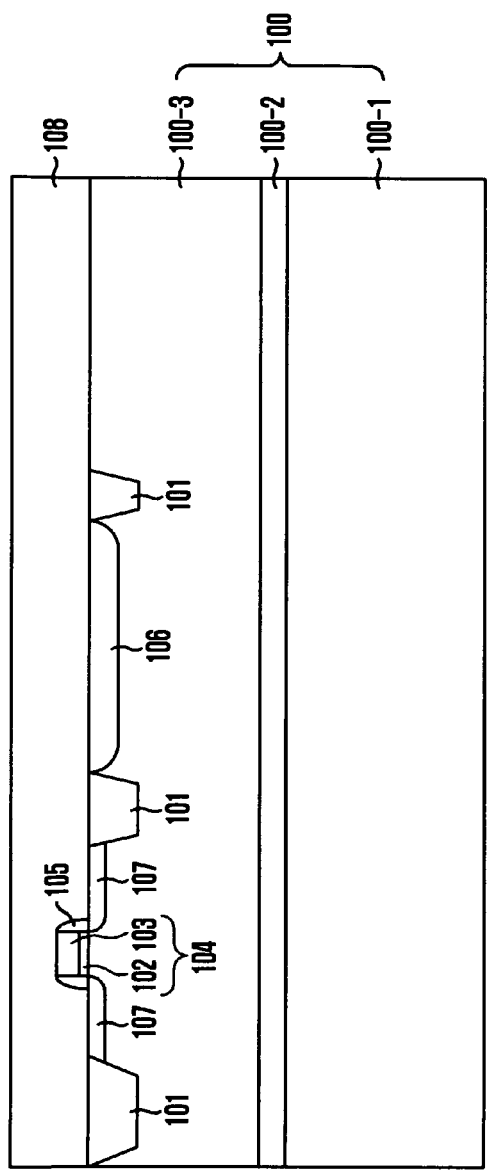

Referring to FIG. 2A, a first substrate 100, for example, an SOI substrate, is prepared. The SOI substrate 100 includes a first semiconductor layer 100-1, a buried oxide layer 100-2, and a second semiconductor layer 100-3. The second semiconductor layer 100-3 may be doped with a first conductivity type or a second conductivity type. For example, the second semiconductor layer 100-3 is doped with the first conductivity type. In addition, the buried oxide layer 100-2 may be formed to a thickness of approximately 500 Å to approximately 10,000 Å, and the second semiconductor layer 100-3 may be formed to a thickness of approximately 1 μm to approximately 10 μm.

A device isolation layer 101 is locally formed in the first substrate 100. Although the device isolation layer 101 may be formed using a shallow trench isolation (STI) process or a local oxidation of silicon (LOCOS) process, it is preferable that the device isolation layer 101 is formed using the STI process that is advantageous to the realization of high integration density, as illustrated in FIG. 2A. If the STI process is applied, the device isolation layer 101 can be formed using an HDP layer, which has an excellent filling characteristic in view of an aspect ratio, or a stacked layer of an HDP layer and a spin on insulation (SOD) layer.

A gate insulation layer 102 and a gate conductive layer 103 are formed over the first substrate 100 and etched to form a gate electrode 104 of a driving transistor. At the same time, although not shown, gate electrodes of a transfer transistor, a reset transistor, and a select transistor constituting a unit pixel of a CMOS image sensor can be formed.

Spacers 105 may be formed on both sidewalls of the gate electrode 104. The spacers 105 may include an oxide layer, a nitride layer, or a stacked layer thereof.

Before forming the spacers 105, a lightly doped drain (LDD) region (not shown) doped with the second conductivity type is formed in the first substrate exposed on both sides of the gate electrode 104.

A photodiode 106 serving as a light receiving element is formed in the first substrate 100 by an ion implantation process. In this case, the photodiode 106 is doped with the second conductivity type at a low concentration.

Source and drain regions 107 doped with the second conductivity type at a high concentration is formed in the first substrate 100 exposed on both sides of the spacers 105. The source and drain regions 107 has a higher doping concentration than the LDD region and the photodiode 106.

In order to prevent surface noise of the photodiode 106, a doping region (not shown) doped with the first conductivity type may be further formed to cover the top surface of the photodiode 106.

Although it has been described above that the gate electrode 104, the spacers 105, the photodiode 106, and the source and drain regions 107 are sequentially formed, their formation order is not limited to the above embodiment, but may be appropriately changed according to the fabricating processes.

A first interlayer insulation layer 108 is formed to cover the first substrate 100, including the gate electrode 104, the spacers 105, the photodiode 106, and the source and drain region 107. The first interlayer insulation layer 108 may include an oxide layer, for example, a silicon-containing oxide layer ($SiO_2$). More specifically, the first interlayer insulation layer 108 may include one layer selected from the group consisting of a BPSG layer, a PSG layer, a BSG layer, a USG layer, a TEOS layer, an HDP layer, and a stacked layer thereof. In addition, the first interlayer insulation layer 108 may include a layer such as an SOD layer which is deposited by a spin coating process.

Figure 2B:
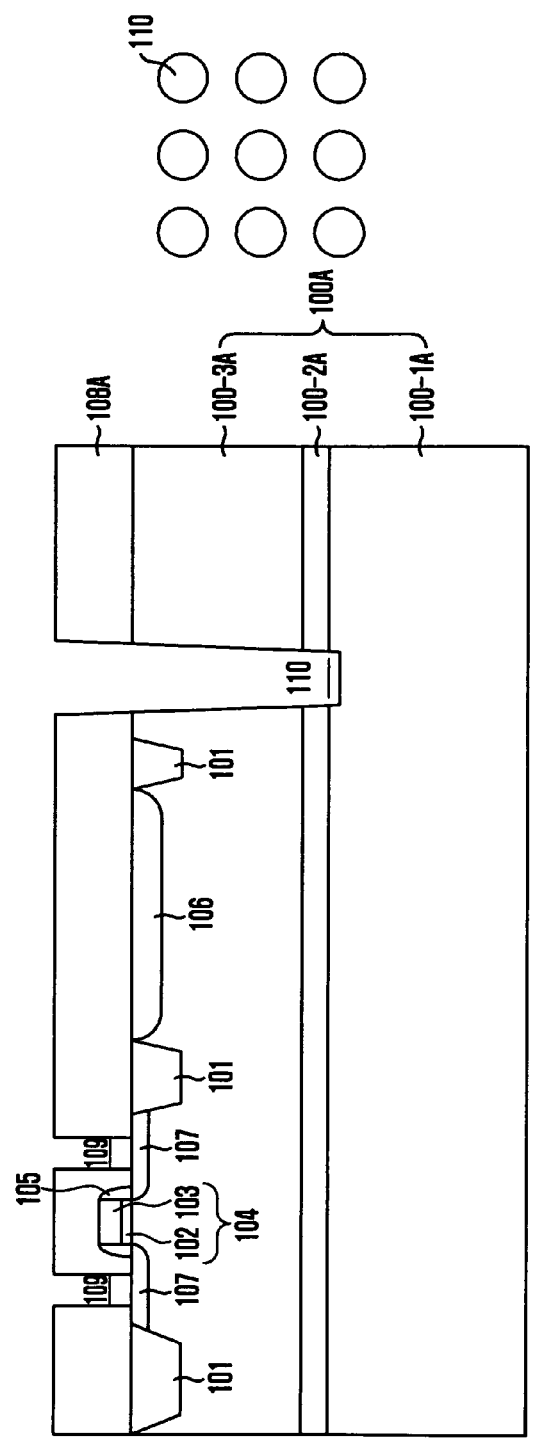

Referring to FIG. 2B, an etching process is performed to locally etch the first interlayer insulation layer 108 to form a contact hole 109 exposing the source and drain regions 107. The etching process may be performed using a dry etching process or a wet etching process. It is preferable to perform the dry etching process so that the first interlayer insulation pattern 108A can have a vertically etched surface.

The first interlayer insulation layer 108 and the first substrate 100 are locally etched. Hereinafter, the etched first interlayer insulation layer 108 and the first substrate 100 are called to a first insulation pattern 108A and first substrate pattern 100A, respectively. Thus, a via hole 110 extending from the interlayer insulation pattern 108A to the first semiconductor pattern 100-1A is formed. At this point, a plurality of via holes 110 may be formed in a matrix configuration.

More specifically, the via hole 110 has a vertical angle of approximately 88 degrees to approximately 90 degrees and a depth of approximately 20,000 Å from the top surface of the interlayer insulation pattern 108A, preferably approximately 4,000 Å to approximately 20,000 Å. More preferably, the via hole 110 is formed to a depth of approximately 1,000 Å to approximately 10,000 Å from the top surface of the second semiconductor pattern 100-3A. In addition, the via hole 110 has a critical dimension (CD) of approximately 0.1 μm to approximately 2.0 μm. The via hole 110 has a bottom width of less than approximately 1.6 μm, preferably approximately 1.0 μm to approximately 1.6 μm. When a plurality of via holes 110 are formed, it is preferable that the deviation in their angles, depths and widths is less than 4%. Furthermore, there is no limitation in the number and shape of the via hole 110. In particular, the via hole 110 may be formed in various shapes, for example, a circular shape or a polygonal (triangular, rectangular, pentagonal, octagonal, etc.) shape.

Meanwhile, there is no limitation in the formation order of the contact hole 109 and the via hole 110. The contact hole 109 may be formed after forming the via hole 110. In addition, the contact hole 109 and the via hole 110 may be formed in-situ within the same plasma etching apparatus.

For example, the via hole 110 is formed using a dry etching process in two steps.

The first step is to etch the interlayer insulation layer 108. The etching process is performed under the conditions that an etch selectivity of the first interlayer insulation layer 108 to a photoresist pattern (not shown) is 5:1 to 2:1, preferably 2.4:1. In addition, an etch rate is in the range of approximately 7,000 Å/min to approximately 8,000 Å/min, preferably 7,200 Å/min. As the etching conditions, a pressure is in the range of approximately 100 mTorr to approximately 200 mTorr, and a source power is in the range of approximately 100 W to approximately 2,000 W. A carbon fluoride compound, for example, $CHF_3$ or $CF_4$, is used as a source gas, and argon (Ar) is further added to the source gas in order to increase an etching speed and anisotropy. A flow rate of $CHF_3$ is in the range of approximately 5 sccm to approximately 200 sccm, a flow rate of $CF_4$ is in the rage of approximately 20 sccm to approximately 200 sccm, and a flow rate of Ar is in the range of approximately 100 to approximately 2,000 sccm.

The second step is to etch the first substrate 100. In the second step, an etch rate is in the range of approximately 1,000 Å/min to approximately 3,000 Å/min, preferably 2,000 Å/min. As the etching conditions, a pressure is in the range of approximately 15 mTorr to approximately 30 mTorr. A source power (RF power) is in the range of approximately 400 W to approximately 600 W, and a bias power for improving the straightness of ions is in the range of approximately 80 W to approximately 120 W. $SF_6$ and $O_2$ is used as a source gas. A flow rate of $SF_6$ is in the range of approximately 5 sccm to approximately 200 sccm, a flow rate of $O_2$ is in the rage of approximately 1 sccm to approximately 100 sccm.

In the second step, the etching process may be performed to etch a portion of the buried oxide layer 100-2 or to etch the buried oxide layer 100-2 and a portion of the first semiconductor layer 100-1. In the former case, the buried oxide layer 100-2 may be over-etched by approximately 100 Å to approximately 4,000 Å. Hereinafter, the etched buried oxide layer 100-2 and etched first semiconductor layer 100-1 are called buried oxide pattern 100-2A and first semiconductor pattern 100-1A, respectively.

Referring to FIG. 2C, barrier layers (not shown) may be formed on inner surfaces of the contact hole (109 in FIG. 2B) and the via hole (110 in FIG. 2B). The barrier layer may include one layer selected from the group consisting of a Ti layer, a TiN layer, a Ta layer, a TaN layer, an AlSiTiN layer, a Niti layer, a TiBN layer, a ZrBN layer, a TiAlN layer, a $TiB_2$ layer, and a stacked layer thereof, for example, a Ti/TiN layer and a Ta/Tan layer. In order to minimize the reduction in the width of the contact hole 109, especially the via hole 110, the barrier layer is formed to a thickness of less than 100 Å, preferably approximately 50 Å to approximately 100 Å, using an atomic layer deposition (ALD) process having an excellent step coverage. In addition, the barrier layer may be formed using a metal organic chemical vapor deposition (MOCVD) process or a physical vapor deposition (PVD) process.

Furthermore, the barrier layer may include an oxide layer (e.g., a silicon oxide layer), a nitride layer (e.g., a silicon nitride layer), and a stacked layer thereof (e.g., a nitride/oxide layer). In the case of the nitride/oxide layer, the oxide layer and the nitride layer are formed in a liner so that the nitride/oxide layer has a total thickness of less than 200 Å. In this way, the reduction in the width of the via hole 110 is minimized.

The contact hole 109 and the via hole 110 are filled with a conductive material to form a first contact plug 111 and an align key 110. The conductive material may include one material selected from the group consisting of copper (Cu); platinum (Pt), tungsten (W), aluminum (Al), and an alloy thereof. The conductive material is not limited to the above-listed materials, but includes any metal or metal alloy having conductive properties. When tungsten (W) is used as the conductive material, a chemical vapor deposition (CVD) process or an ALD process is used. When aluminum (Al) is used as the conductive material, a CVD process is used. When copper (Cu) is used as the conductive material, an electroplating process or a CVD process is used.

Meanwhile, as described above, the first contact plug 111 and the align key 112 may be formed at the same time. Also, the align key 112 may be formed after forming the first contact plug 111, and vice versa. When the first contact plug 111 and the align key 112 are not formed at the same time, they may be formed of different materials. For example, the first contact plug 111 is formed of impurity-doped polysilicon, and the align key 112 is formed of the above-described material.

A method for forming the first contact plug 111 and the align key 112 will be described below. The impurity-doped polysilicon or the above-described material is deposited to fill the contact hole 109, and an etch-back process or a CMP process is performed to form the first contact plug 111 filling the contact hole 109. Then, a conductive material is deposited to fill the via hole 110, and an etch-back process or a CMP process is performed to form the align key 112 filling the via hole 110.

Figure 2D:
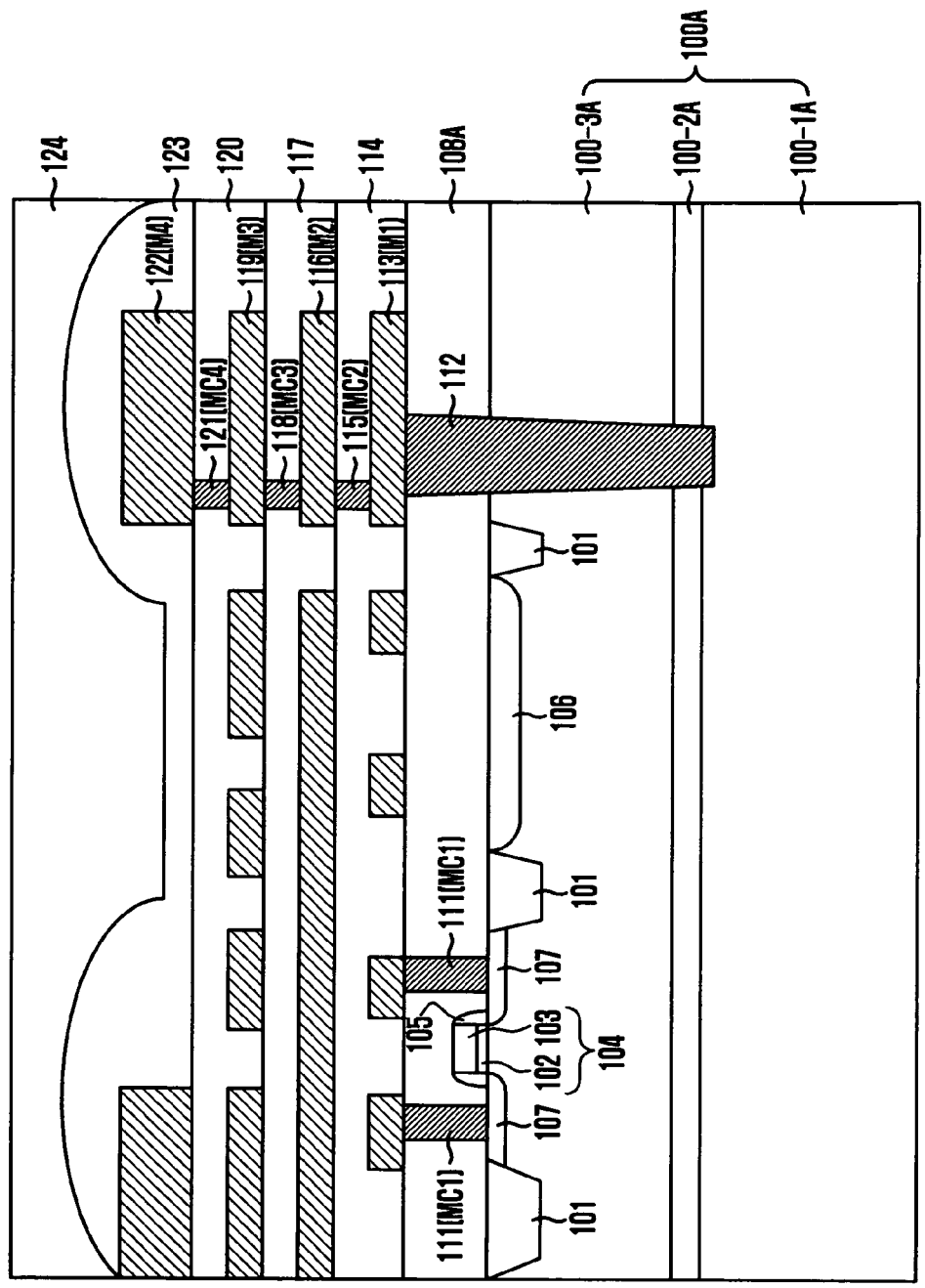

Referring to FIG. 2D, first to fourth interconnection layers 113, 116, 119 and 122, second to fourth contact plugs 115, 118 and 121, second to fifth interlayer insulation layers 114, 117, 120 and 123 are formed. For example, a portion of the first interconnection layer 113 among the first to fourth interconnection layers 113, 116, 119 and 122 is electrically separated and connected to the first contact plug 111, and another portion of the first interconnection layer 113 is connected to the align key 112.

The first to fourth interconnection layers 113, 116, 119 and 122 are formed using a deposition process and an etching process. The first fourth interconnection layers 113, 116, 119 and 122 are formed of a conductive material, for example, a metal, or an alloy containing at least two metals. Preferably, the first to fourth interconnection layers 113, 116, 119 and 122 are formed of aluminum (Al). The second to fourth contact plugs 115, 118 and 121 are formed in the second to fifth interlayer insulation layers 114, 117, 120 and 123 by a damascene process. In order to electrically connect the first to fourth interconnection layers 113, 116, 119 and 122 that are vertically stacked, the second to fourth contact plugs 115, 118 and 121 are formed of a conductive material, for example, an impurity-doped polysilicon and a metal, or an alloy containing at least two metals. Preferably, the second to fourth contact plugs 115, 118 and 121 are formed of tungsten (W). The second to fifth interlayer insulation layers 114, 117, 120 and 123 may include an oxide layer selected from the group consisting of a BPSG layer, a PSG layer, a BSG layer, an USG layer, a TEOS layer, and an HDP layer, or a stacked layer thereof. In addition, the second to fourth interlayer insulation layers 114, 117 and 120 may be planarized using a CMP process.

There is no limitation in the layer number and structure of the first to fourth interconnection layers 113, 116, 119 and 122 and the second to fourth contact plugs 115, 118 and 121. The layer number and structure of the interconnection layers and the contact plugs may be variously changed according to the device design.

A passivation layer 124 is formed over the fifth interlayer insulation layer 123. The passivation layer 124 may include one layer selected from the group consisting of a BPSG layer, a PSG layer, a BSG layer, an USG layer, a TEOS layer, and an HDP layer. Preferably, the passivation layer 124 is formed using the TEOS layer or the HDP layer to a thickness of approximately 1,000 Å to approximately 40,000 Å. In addition, the passivation layer 124 may include a nitride layer or a stacked layer of an oxide layer and a nitride layer.

The passivation layer 124 is planarized. The planarization process may be performed using a chemical mechanical polishing (CMP) process.

A thermal treatment may be performed for densifying the passivation layer 124. The thermal treatment may be performed using an annealing process using a furnace.

Figure 2E:
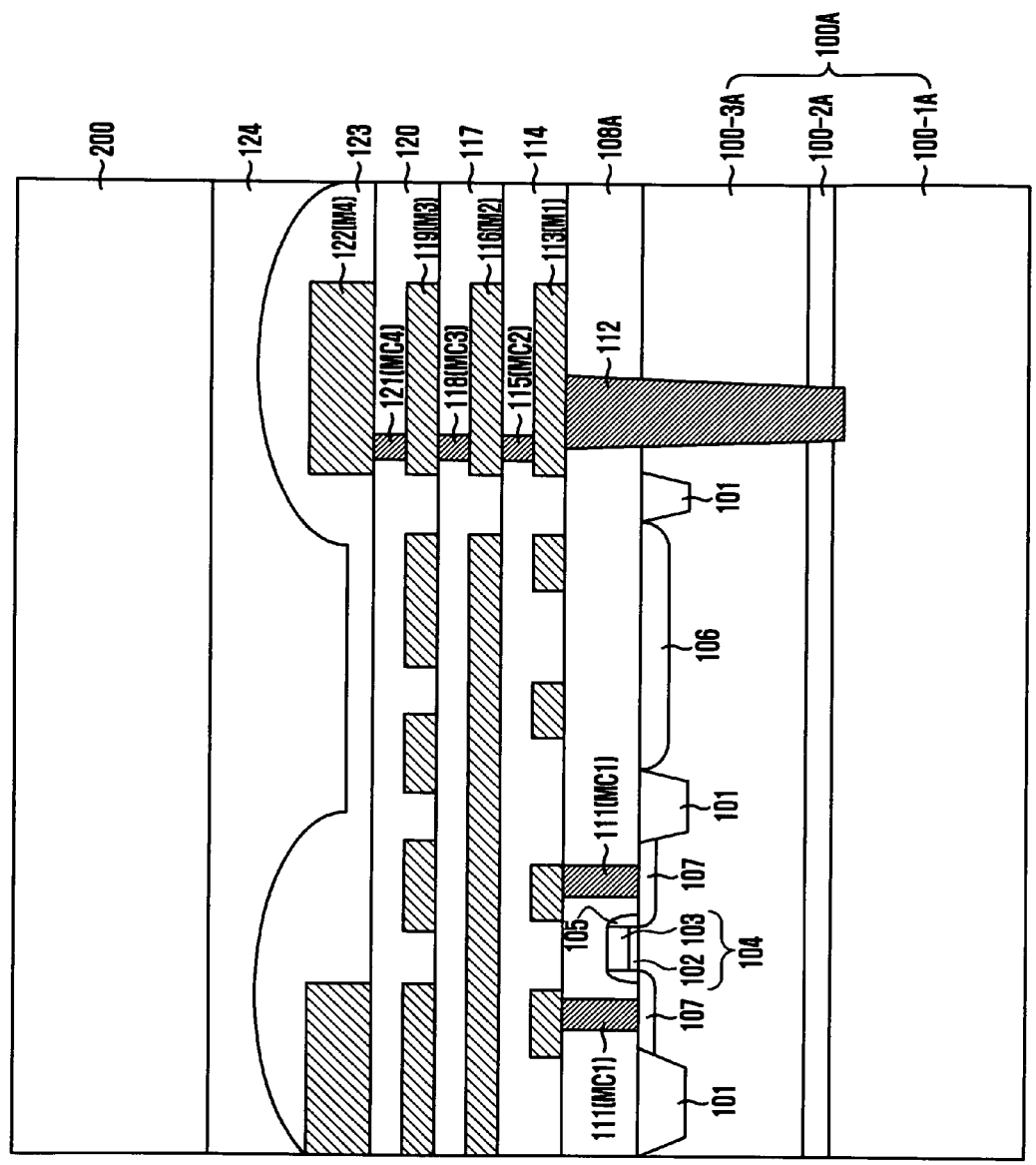

Referring to FIG. 2E, the first substrate pattern 100A fabricated by the processes of FIGS. 2A to 2D is bonded to a second substrate 200. The bonding process is performed using one method selected from the group consisting of an oxide/oxide bonding, an oxide/silicon bonding, an oxide/metal bonding, an oxide/adhesive/oxide bonding, and an oxide/adhesive/silicon bonding.

For example, the oxide/oxide (formed over the second substrate 200) bonding and the oxide/silicon (silicon substrate) bonding are to bond the two substrates after a plasma treatment using $O_2$ or $N_2$ and a water treatment. In addition to the method of bonding two substrates after the water treatment, the two substrates can be bonded together after a chemical treatment using amine. In the oxide/metal (formed over the second substrate 200) bonding, the metal layer may be formed of a metal such as titanium (Ti), aluminum (Al) or copper (Cu). In the oxide/adhesive/oxide bonding and the oxide/adhesive/silicon bonding, benzo cyclo butene (BCB) may be used as the adhesive member.

Figure 2F:
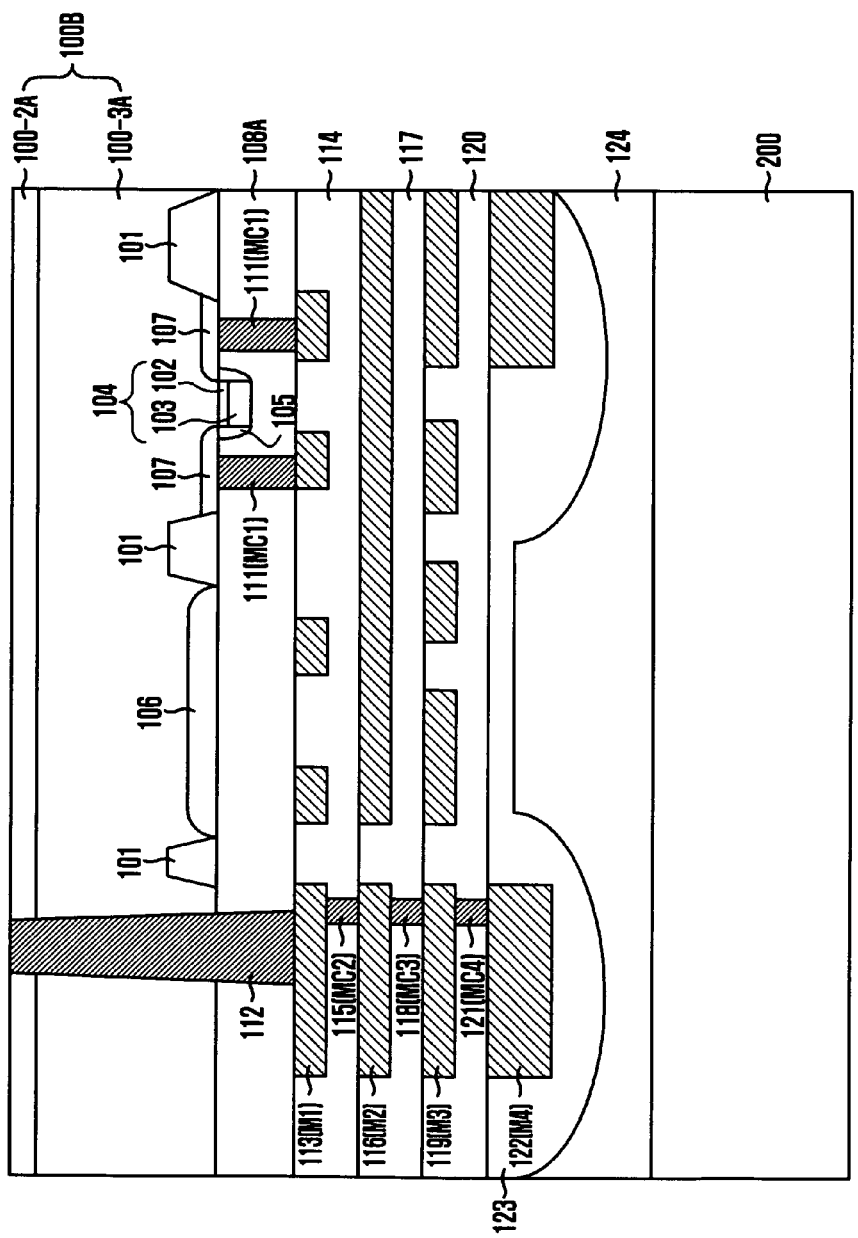

Referring to FIG. 2F, a back grinding process is performed to grind the backside of the first substrate pattern 100A (refer to FIG. 2E). In this case, if the align key 112 is formed to pass through the buried oxide pattern 100-2A, the align key 112 is exposed by performing the back grinding process until the buried oxide pattern 100-2A is exposed. During this process, the buried oxide pattern 100-2A may be removed by a predetermined thickness. Meanwhile, if the align key 112 is formed not to pass through the buried oxide pattern 100-2A, that is, the align key 112 extends into the buried oxide pattern 100-2A by a predetermined depth, the buried oxide pattern 100-2A may be partially or entirely removed to expose the align key 112. Alternatively, the buried oxide pattern 100-2A may be etched by a separate etching process.

Figure 2G:
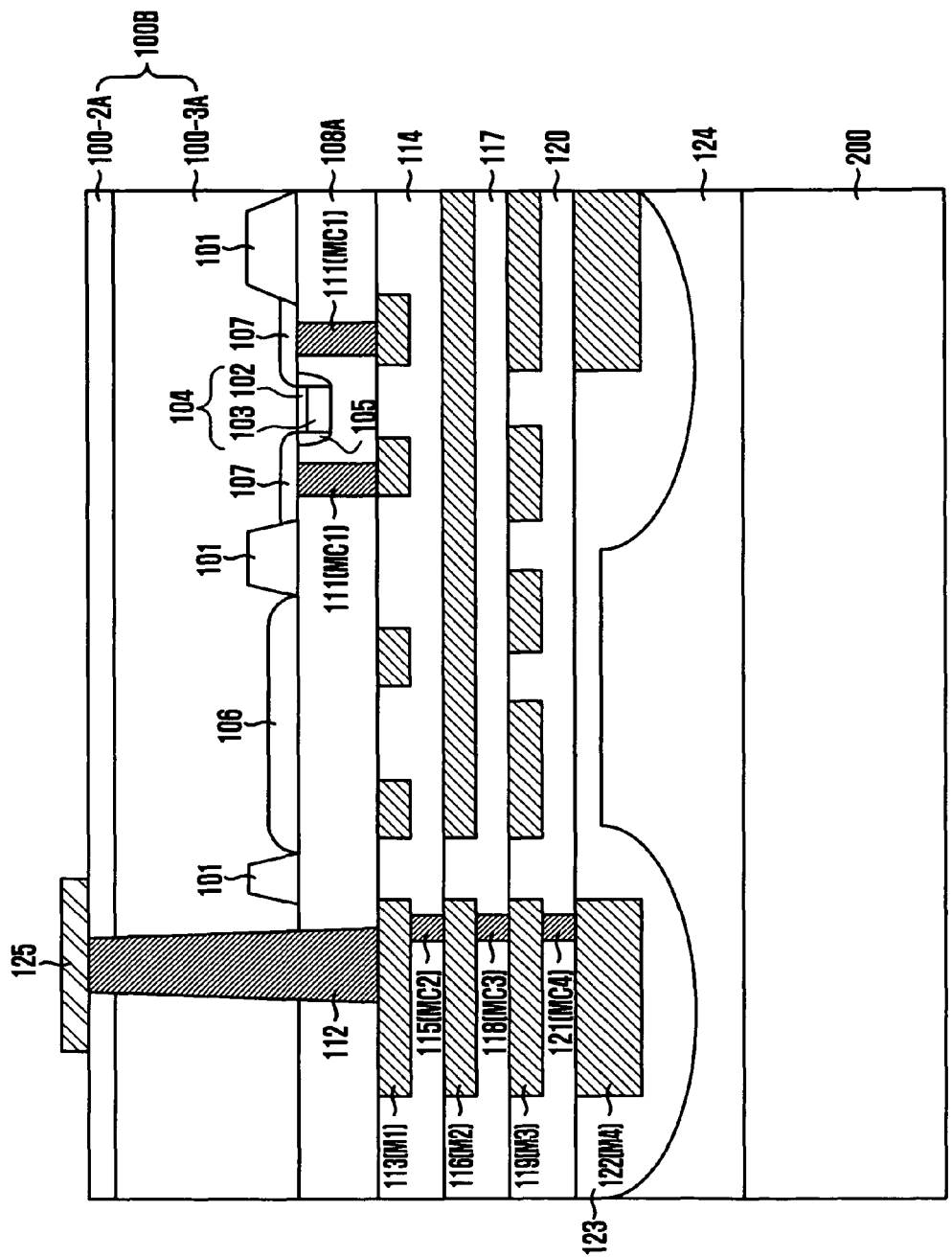

Referring to FIG. 2G, a plurality of pads 125 electrically connected to the backside of the align key 112 are formed on the backside of the buried oxide pattern 100-2A. The pads 125 may be formed of a conductive material, such as a metal or an alloy containing at least two kinds of metals. Preferably, the pads 125 are formed of aluminum (Al). In addition, the pads 125 may be connected to the align keys 112 arranged in a matrix configuration.

Figure 2H:
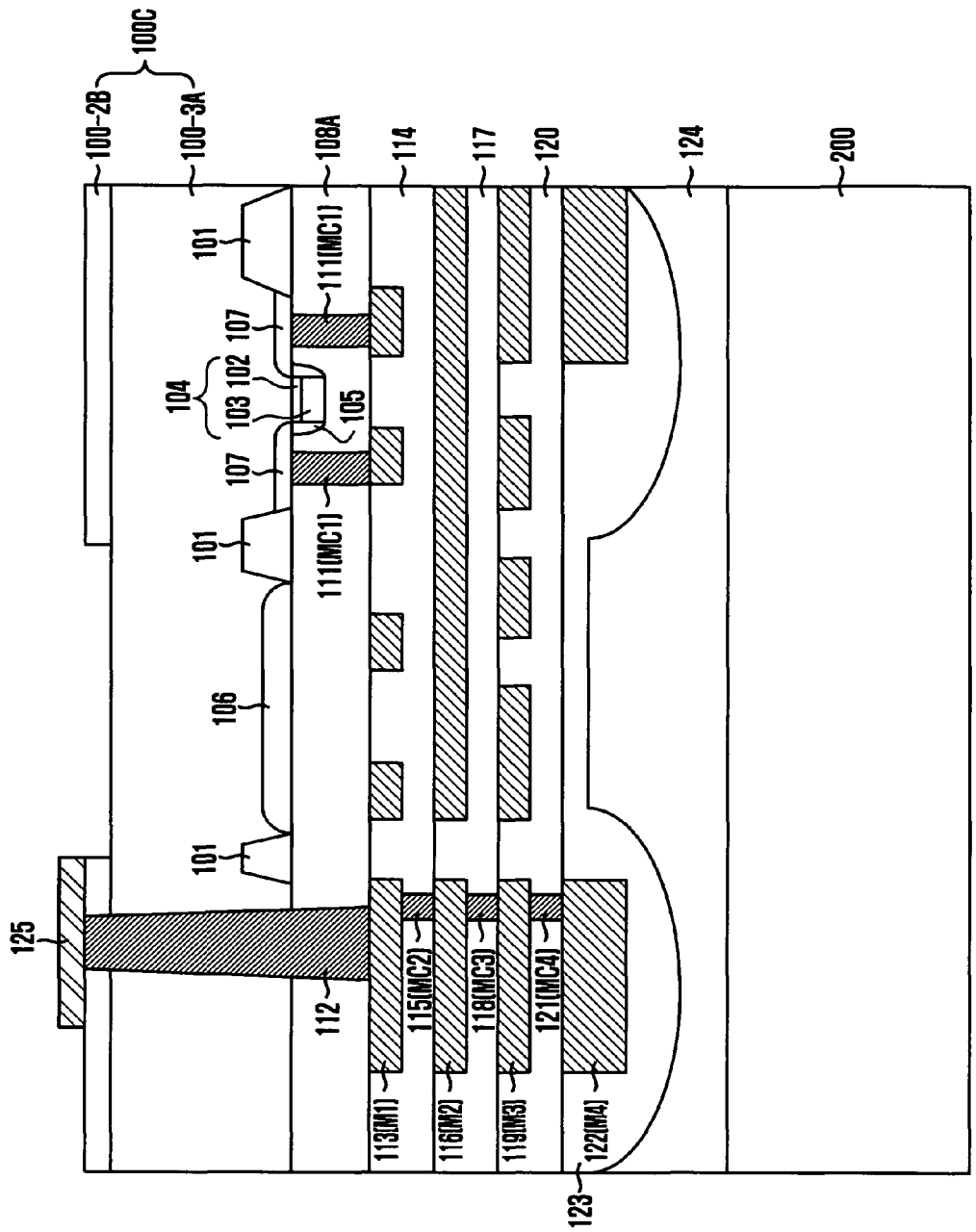
Figure 21:
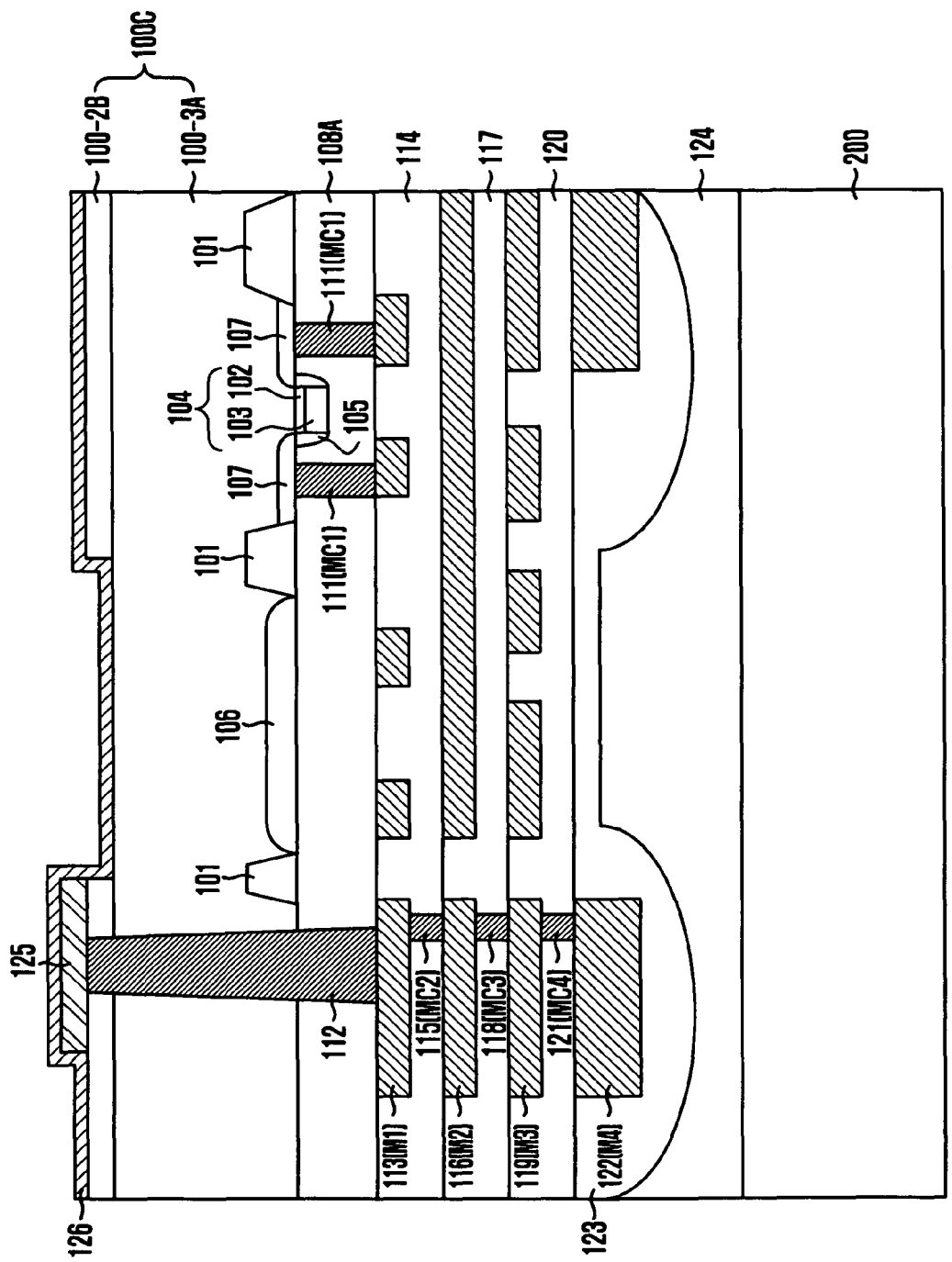

Referring to FIG. 2H, a portion of the buried oxide pattern 100-2A overlapping the photodiode 106 is etched and removed. That is, the buried oxide pattern 100-2A is locally removed such that it does not exist in the region overlapping the photodiode 106. Hereinafter, the etched buried oxide pattern 100-2A is called a remaining buried oxide pattern 100-2B. Accordingly, a portion of the second semiconductor pattern 100-3A corresponding to the overlapping region is exposed.

Referring to FIG. 2I, a light anti-scattering layer 126 is formed over the pad 125, the second semiconductor layer 100-3A, and the buried oxide layer 100-2B. The light anti-scattering layer 126 may be formed of in a multi-layered structure where materials having different refractive indexes are stacked. For example, the light anti-scattering layer 126 may include a stacked layer (an oxide/nitride layer or a nitride/oxide layer) of an oxide layer and a nitride layer, or a stacked layer (an oxide/SiC layer or an SiC/oxide layer) of an oxide layer and a carbon-containing layer (SiC).

In this case, the oxide layer may include one layer selected from the group consisting of a TEOS layer, an USG layer, an HDP layer, a BSG layer, a PSG layer and a BPSG layer. The nitride layer may include a silicon nitride ($Si_xN_y$) layer, where x and y are natural numbers, or a silicon oxynitride ($Si_xO_yN_z$) layer, where x, y and z are natural numbers. The nitride layer may include an N—H rich nitride layer having more N—H bonds than $Si_3N_4$ which is bonded in a relatively stable state. In the forming of the N—H rich nitride layer, a flow ratio ($SiH_4:NH_3$) of a silane gas ($SiH_4$) to an ammonia gas ($NH_3$) is in the range of approximately 1:1 to approximately 1:20, preferably, 1:10.

In addition, the nitride layer or the SiC layer are formed thinly. The oxide layer may be formed to a thickness of approximately 1,000 Å to approximately 10,000 Å, and the nitride layer or the SiC layer may be formed to a thickness of approximately 100 Å to approximately 5,000 Å.

Meanwhile, the deposition process of the light anti-scattering layer 126 having the multi-layered structure may be performed in-situ within the same chamber in order to obtained the increased stability and the reduced processing time of the fabricating process. If the in-situ process is impossible, the deposition process may be performed ex-situ in a different chamber.

Figure 2J:
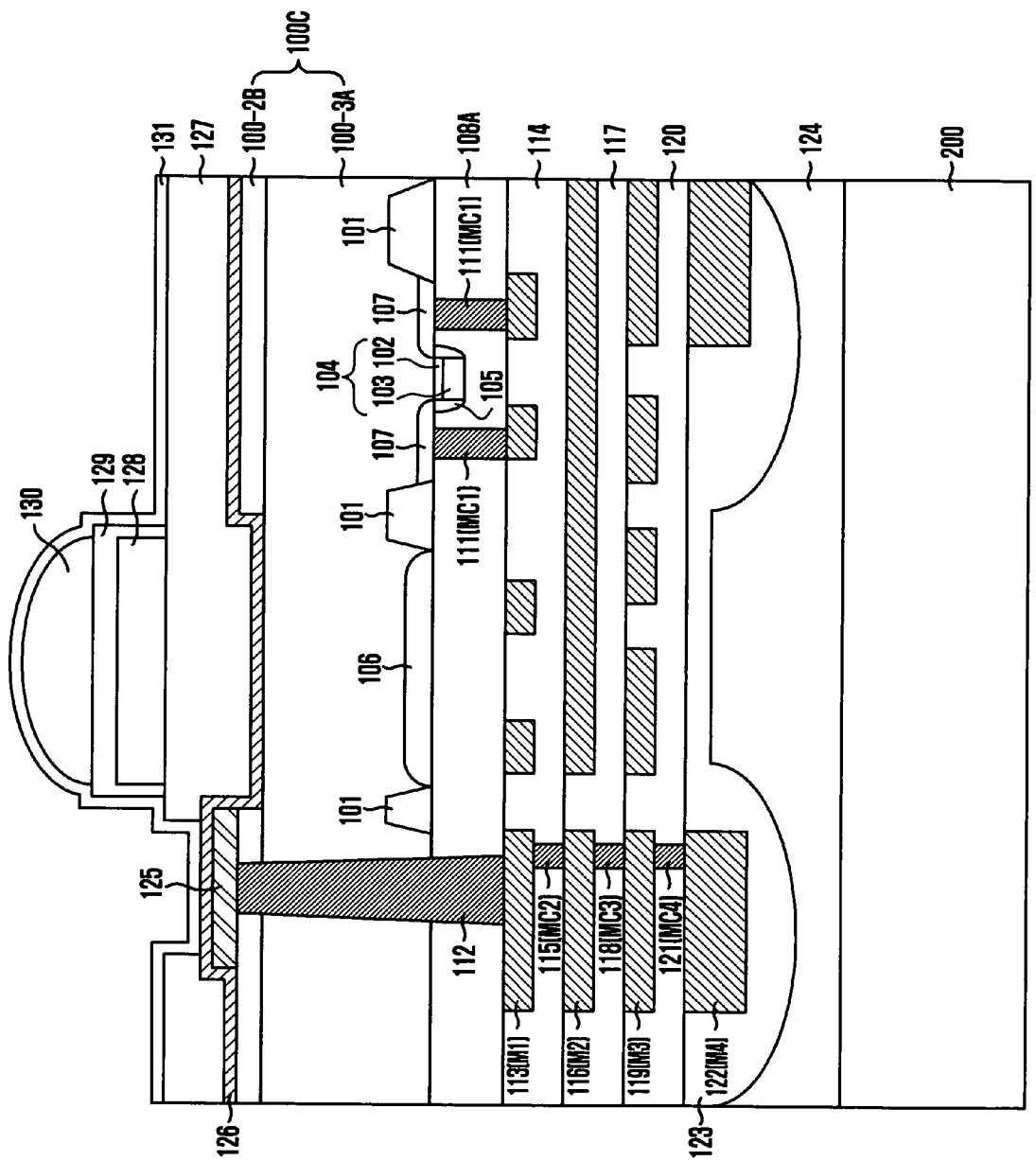

Referring to FIG. 2J, a passivation layer 126 may be formed over the light anti-scattering layer 126. The passivation layer 127 may be formed of an insulating material, for example, oxide.

The passivation layer 127 may be locally etched to expose a portion of the light anti-scattering layer 126 over the pad 125.

A color filter 128 and a microlens 130 are sequentially formed over the passivation layer 127 overlapping the photodiode 106. A planarization layer 129 may be formed as an over coating layer (OCL) between the passivation layer 127 and the color filter 128 and between the color filter 128 and the microlens 130. The planarization layer 129 may be formed of an organic material.

A low temperature oxide (LTO) layer 131 may be formed over the microlens 130, the light anti-scattering layer 126, and the passivation layer 127.

Figure 2K:
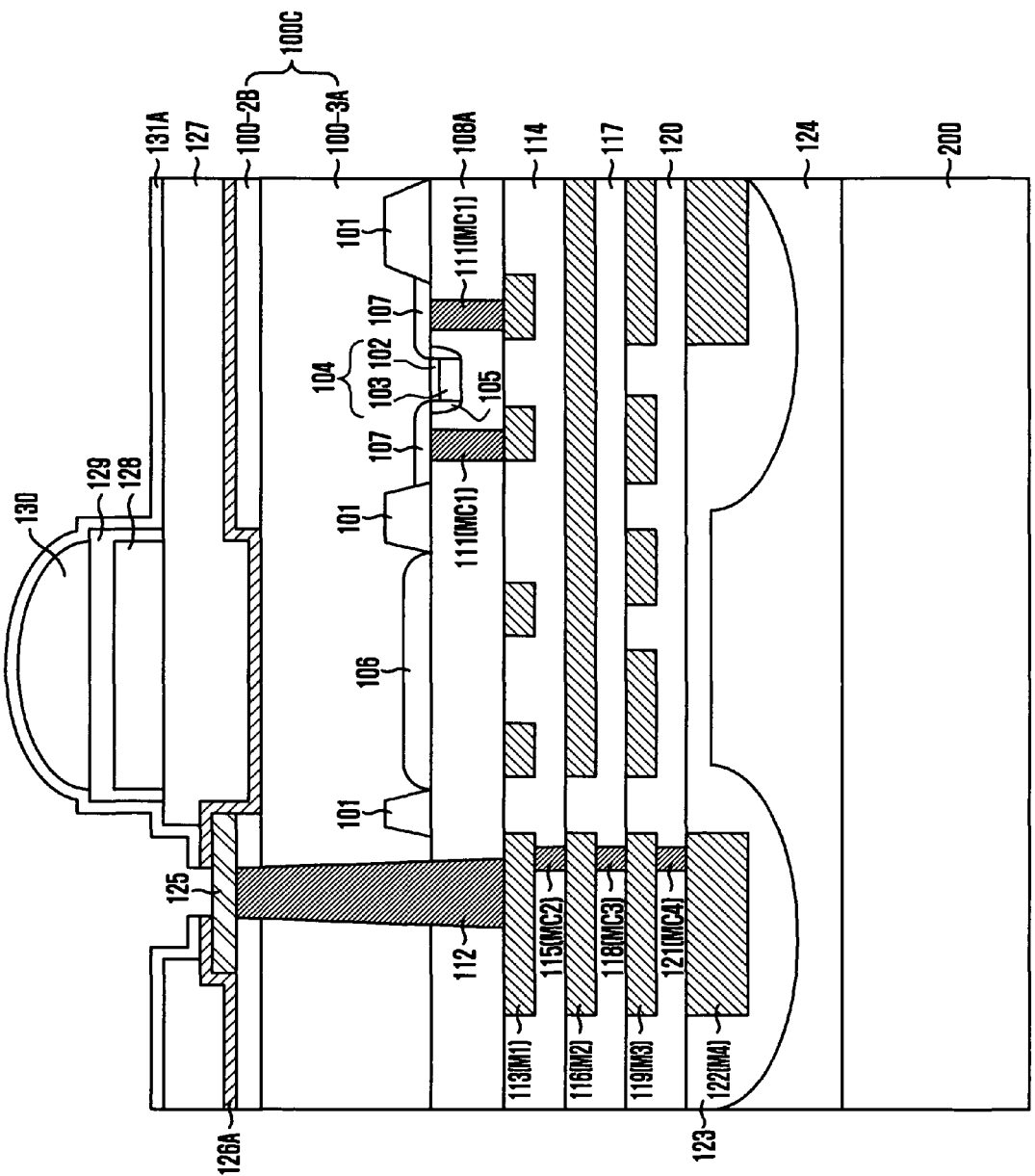

Referring to FIG. 2K, the LTO layer 131 and the light anti-scattering layer 126 are locally etched to expose the pad 125 partially or entirely in order for wire bonding. Hereinafter, the etched LTO layer 131 and the anti-scattering layer 126 are called LTO pattern 131A and anti-scattering pattern 126A, respectively.

The first substrate 100C and the second substrate 200 are packaged by a packaging process. The packaging process includes a wire bonding process and a sawing process. The wire bonding is achieved by bonding the pad 125 to an external chip through a wire.

Figure 3:
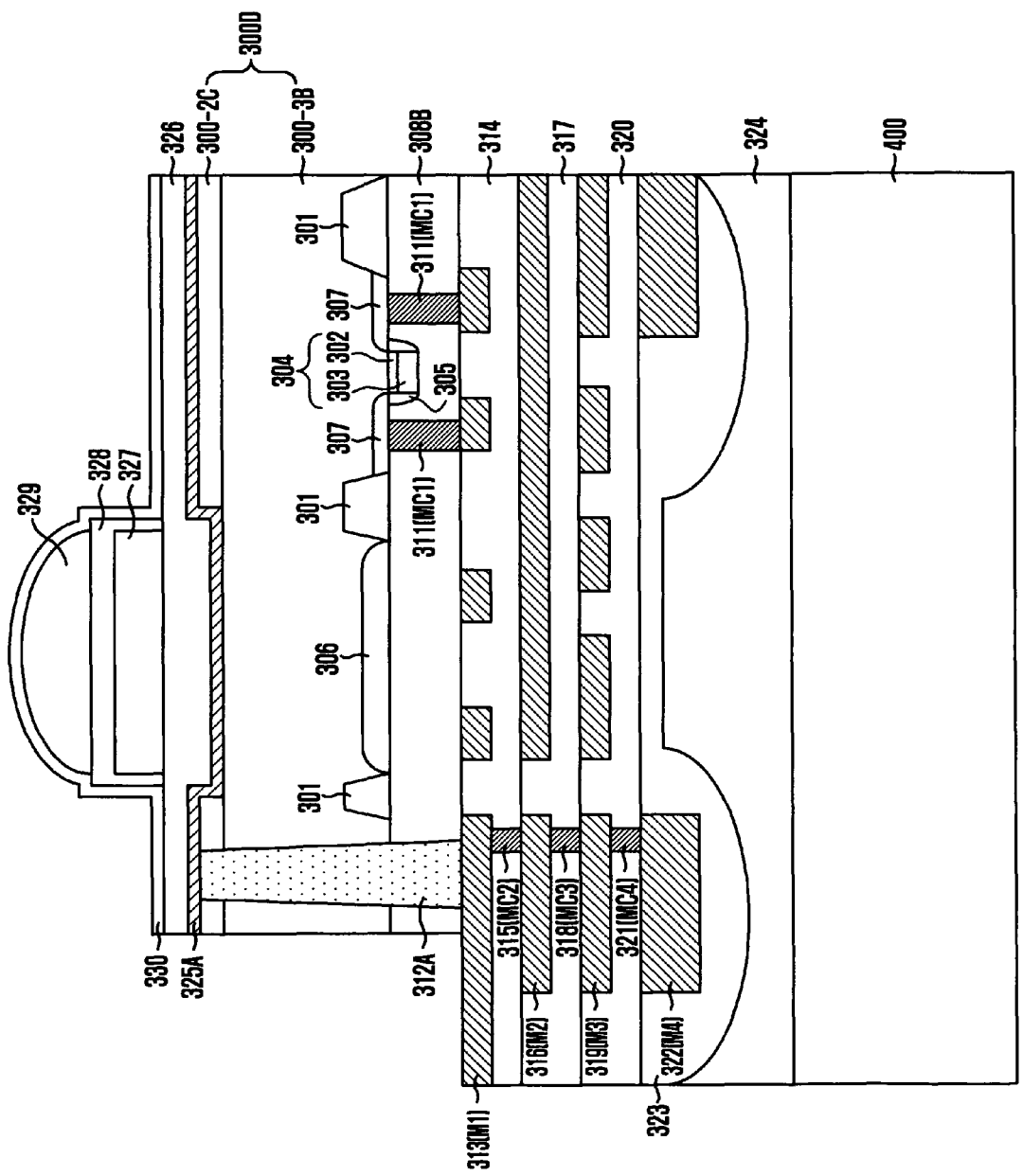
FIG. 3 illustrates a cross-sectional view of a backside illuminated image sensor in accordance with a second embodiment of the present invention.

FIG. 3 illustrates a cross-sectional view of a backside illuminated image sensor in accordance with a second embodiment of the present invention. Only a photo diode and a gate electrode including a driving transistor in a unit pixel of a CMOS image sensor are illustrated for convenience.

Referring to FIG. 3, the backside illuminated image sensor in accordance with the second embodiment of the present invention includes a light receiving element, for example, a photodiode 306, which is formed in a first substrate 300D, a remaining interlayer insulation pattern 308B formed over the first substrate 300D including the photodiode 306, an align key pattern 312A spaced apart from the photodiode 306 and passing through the remaining interlayer insulation pattern 308B and the first substrate 300D, first to fourth interconnection layers 313, 316, 319 and 322 formed over the remaining interlayer insulation pattern 308B in a multi-layered structure, where the backside of the first interconnection layer 313 among the first to fourth interconnection layers 313, 316, 319 and 322 is exposed, a passivation layer 324 covering the first to fourth interconnection layers 313, 316, 319 and 322, a light anti-scattering pattern 325A formed on the backside of the first substrate 300D, and a color filter 327 and a microlens 329 overlapping the photodiode 306 on the light anti-scattering pattern 325A. The backside illuminated image sensor further includes a second substrate 400 boned to the top surface of the passivation layer 324.

The structure of the second embodiment is similar to that of the first embodiment. While the pad is connected to the backside of the first substrate 100C (refer to FIG. 1) in the first embodiment, the second embodiment is characterized in that the backside of the first interconnection layer 313 is exposed and used as the pad, or a separate pad is formed over the first interconnection layer 313. That is, the first embodiment and the second embodiment have the same structure, except the location of the pad. In addition, the second embodiment differs from the first embodiment in that the align key pattern 312A is formed of an insulating material, instead of the conductive material.

In the first embodiment and the second embodiment, only the pad related structure and the material of the align key are different and the other structures are equal. Therefore, detailed description about the other elements will be omitted for simplicity.

A method for fabricating a backside illuminated image sensor in accordance with a second embodiment of the present invention will be described below.

The processes of FIGS. 4A and 4B are performed in the same manner as those of FIGS. 2A and 2B.

Figure 4C:
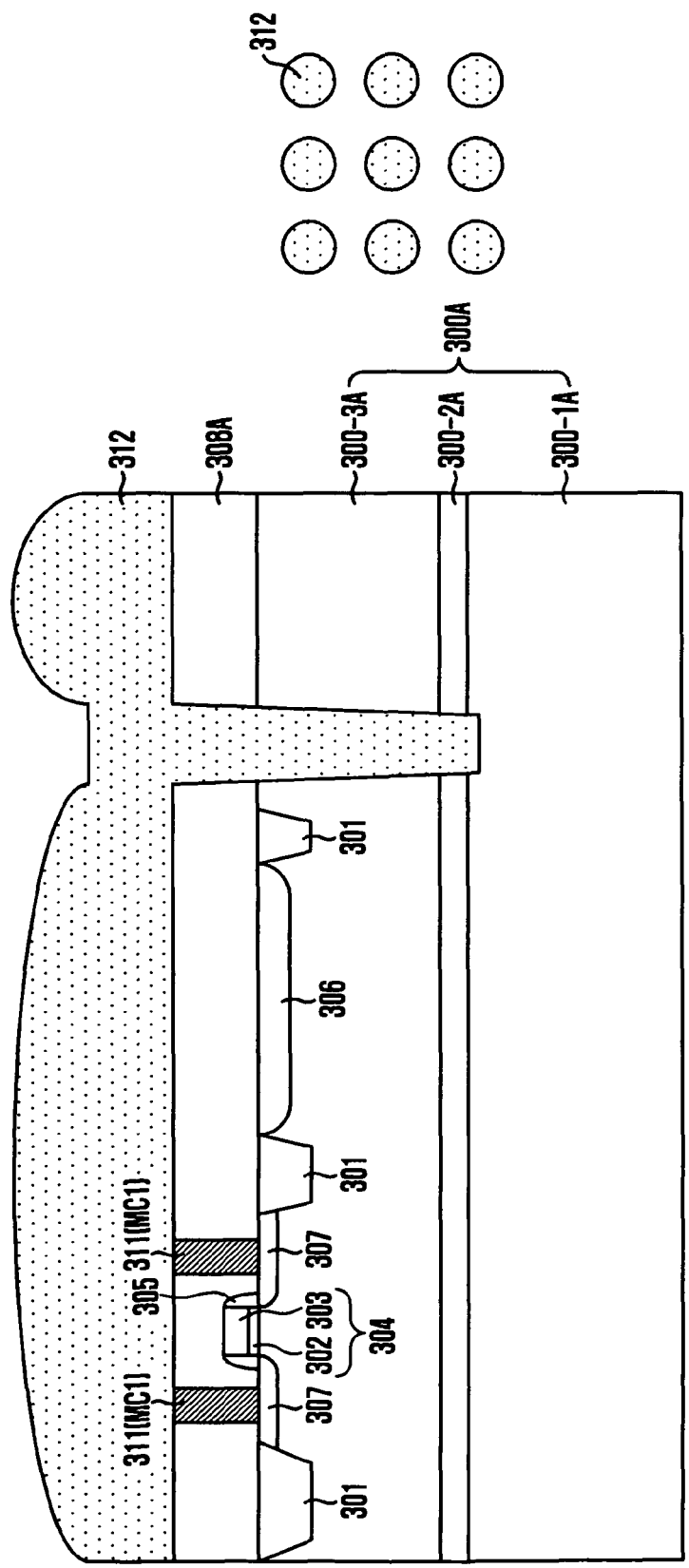

Referring to FIG. 4C, the contact hole (309 in FIG. 4B) is filled with a conductive material to form a first contact plug 311. The conductive material may include one material selected from the group consisting of copper (Cu), platinum (Pt), tungsten (W), aluminum (Al), and an alloy thereof. The conductive material is not limited to the above-listed materials, but includes any metal or metal alloy having conductive properties. When tungsten (W) is used as the conductive material, a chemical vapor deposition (CVD) process or an ALD process is used. When aluminum (Al) is used as the conductive material, a CVD process is used. When copper (Cu) is used as the conductive material, an electroplating process or a CVD process is used.

An insulating material 312 is formed over the interlayer insulation pattern 308A, filling the via hole 310 (refer to FIG. 4B). Preferably, the insulating material 312 having an excellent filling characteristic is used. For example, the insulating material 312 includes an oxide-based material or a nitride-based material. Specifically, the oxide-based material may include silicon oxide, such as BPSG, BSG, USG, TEOS, and HDP, or a stack thereof. In addition, the nitride-based material includes silicon nitride. A layer formed by a spin coating, such as an SOD layer having an excellent step coverage may be formed.

Figure 4D:
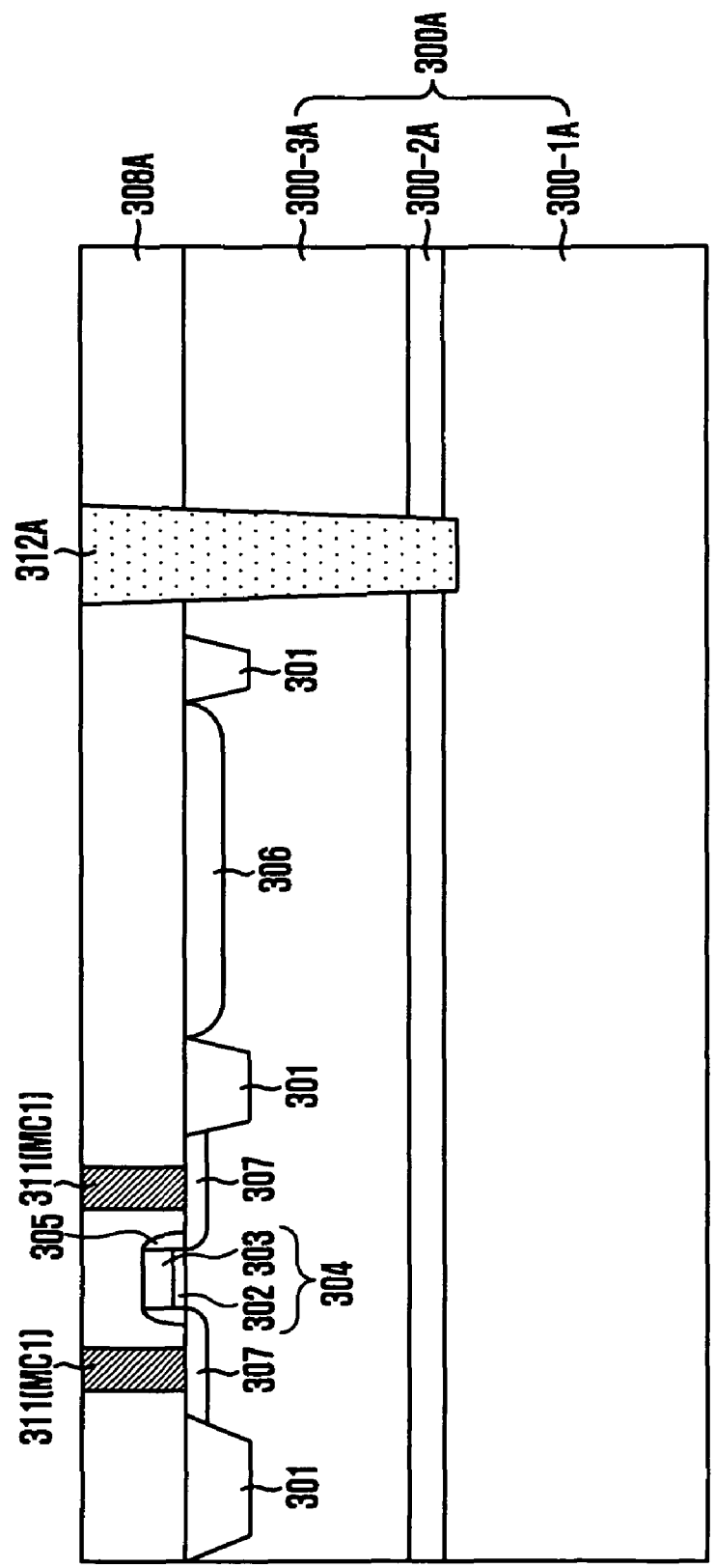

Referring to FIG. 4D, an align key pattern 312A having a pillar structure is formed to fill the via hole (310 in FIG. 4B) by a planarization process. The planarization process may be performed using an etch-back process or a CMP process.

Figure 4E:
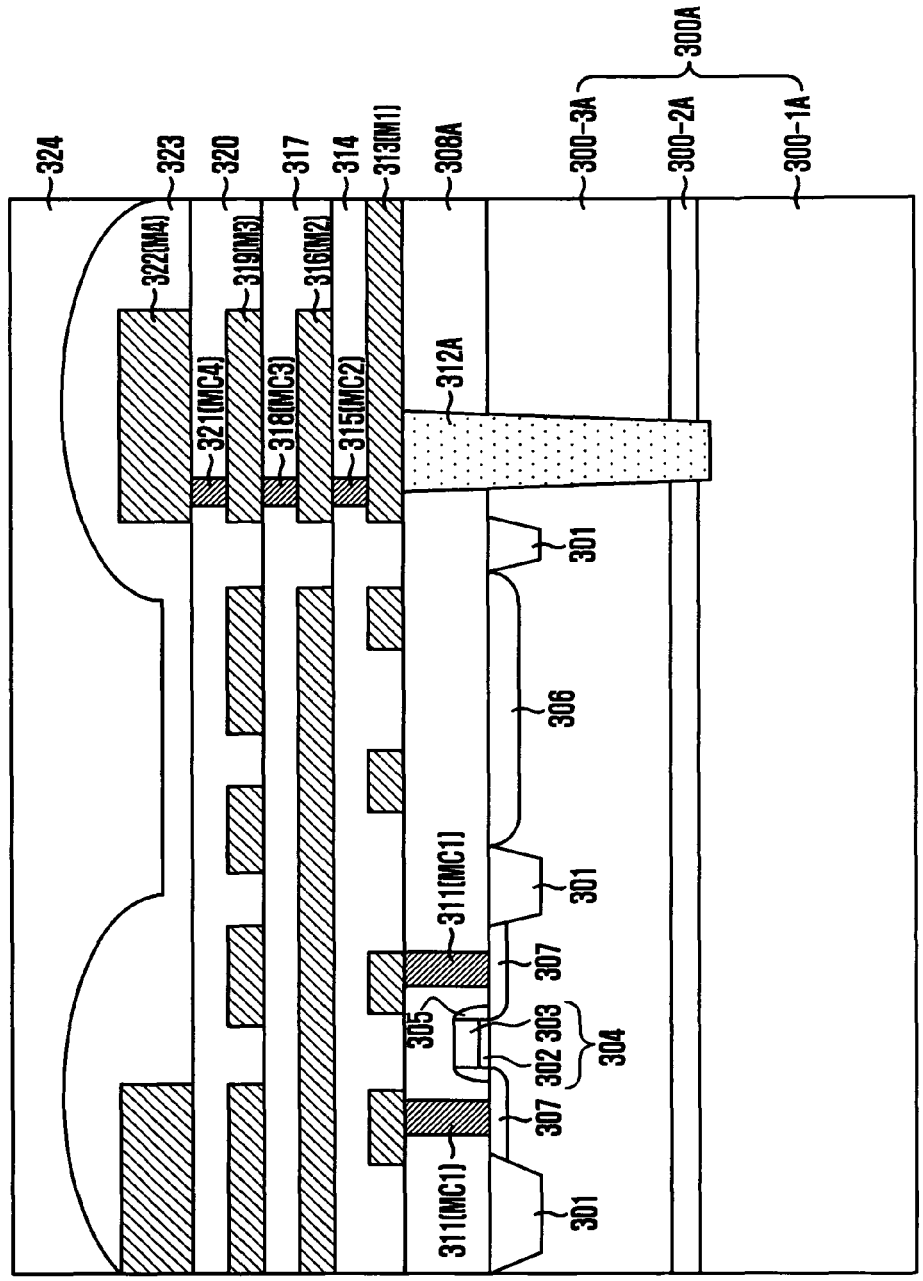
Figure 4F:
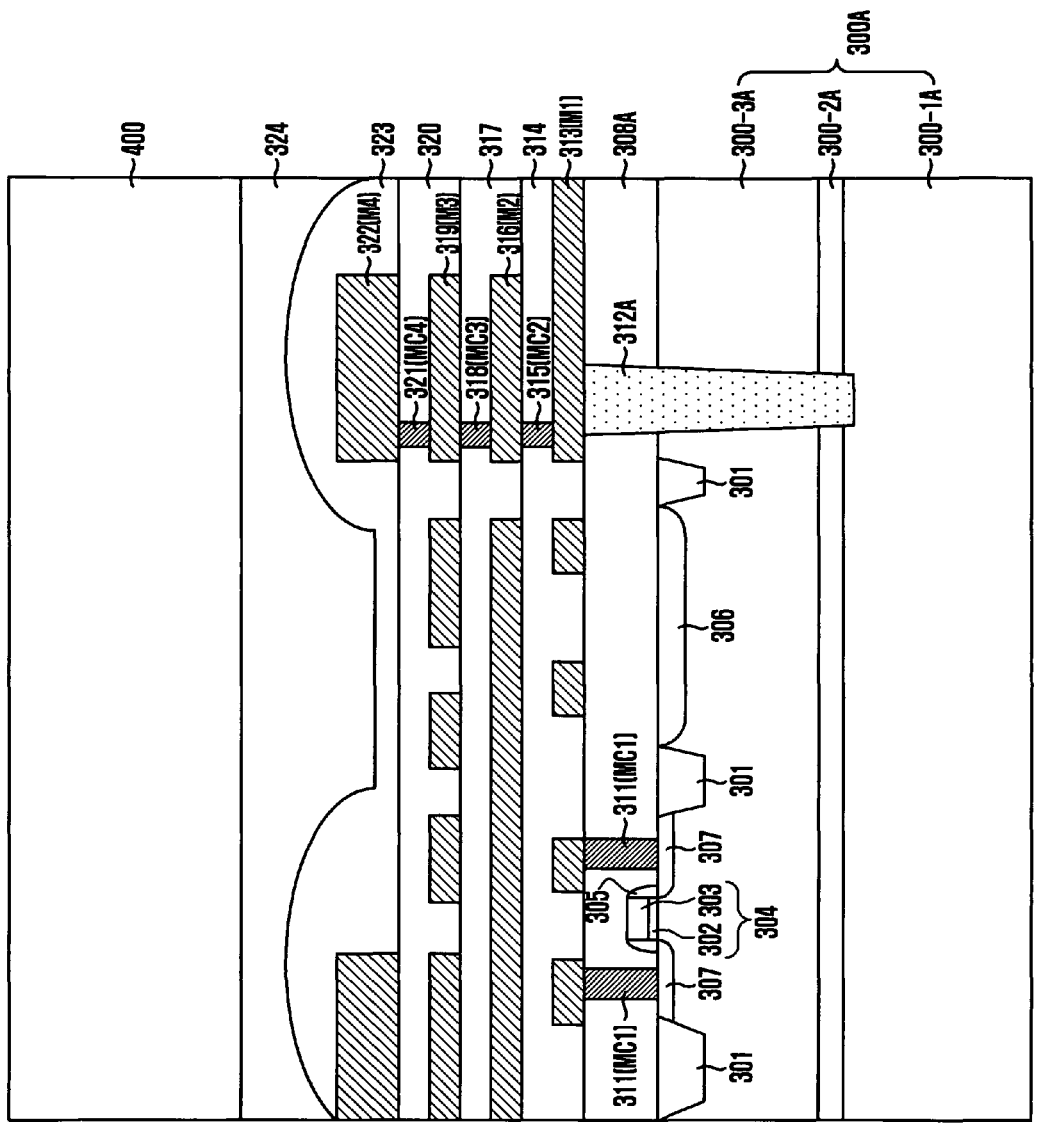
Figure 4G:
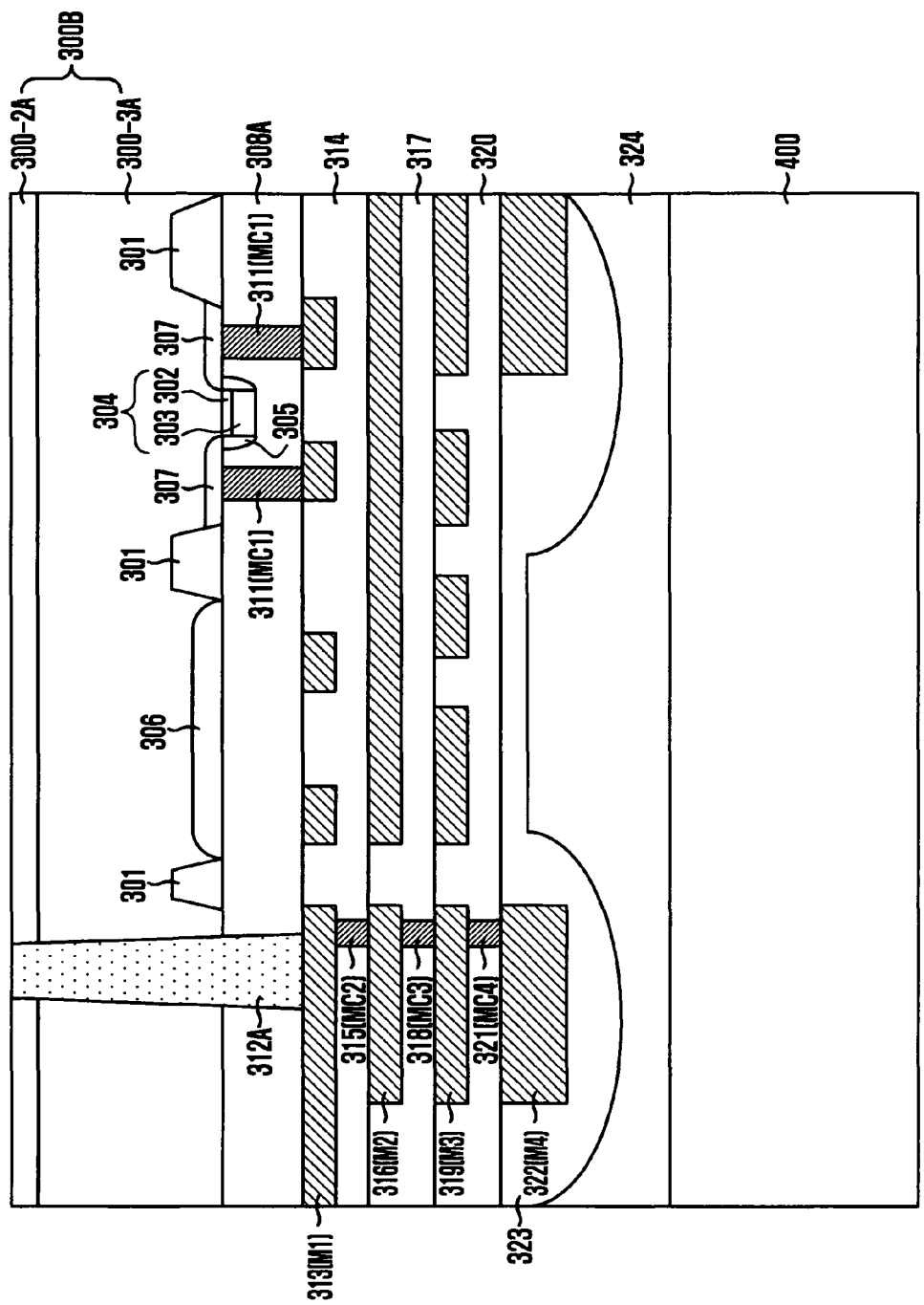

The processes of FIGS. 4E to 4G are performed in the same manner as those of FIGS. 2D to 2F.

Figure 4H:
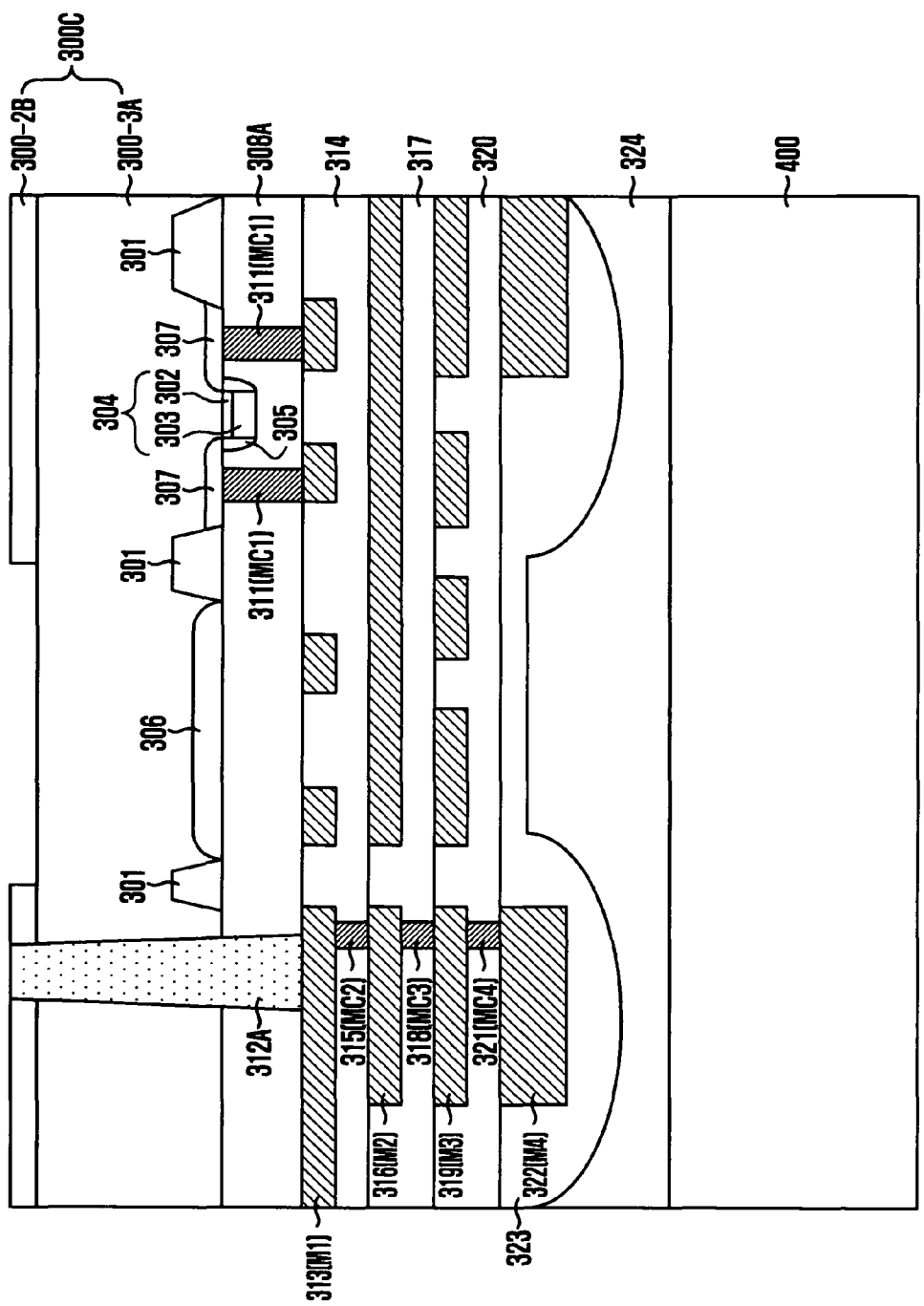

Referring to FIGS. 4H and 4I, the buried oxide layer 300-2B is etched to expose a portion (a region overlapping the photodiode) of the semiconductor layer 300-3A except the pad, and the light anti-scattering layer 325 is formed. These processes are performed in the same manner as those of the first embodiment.

Figure 4J:
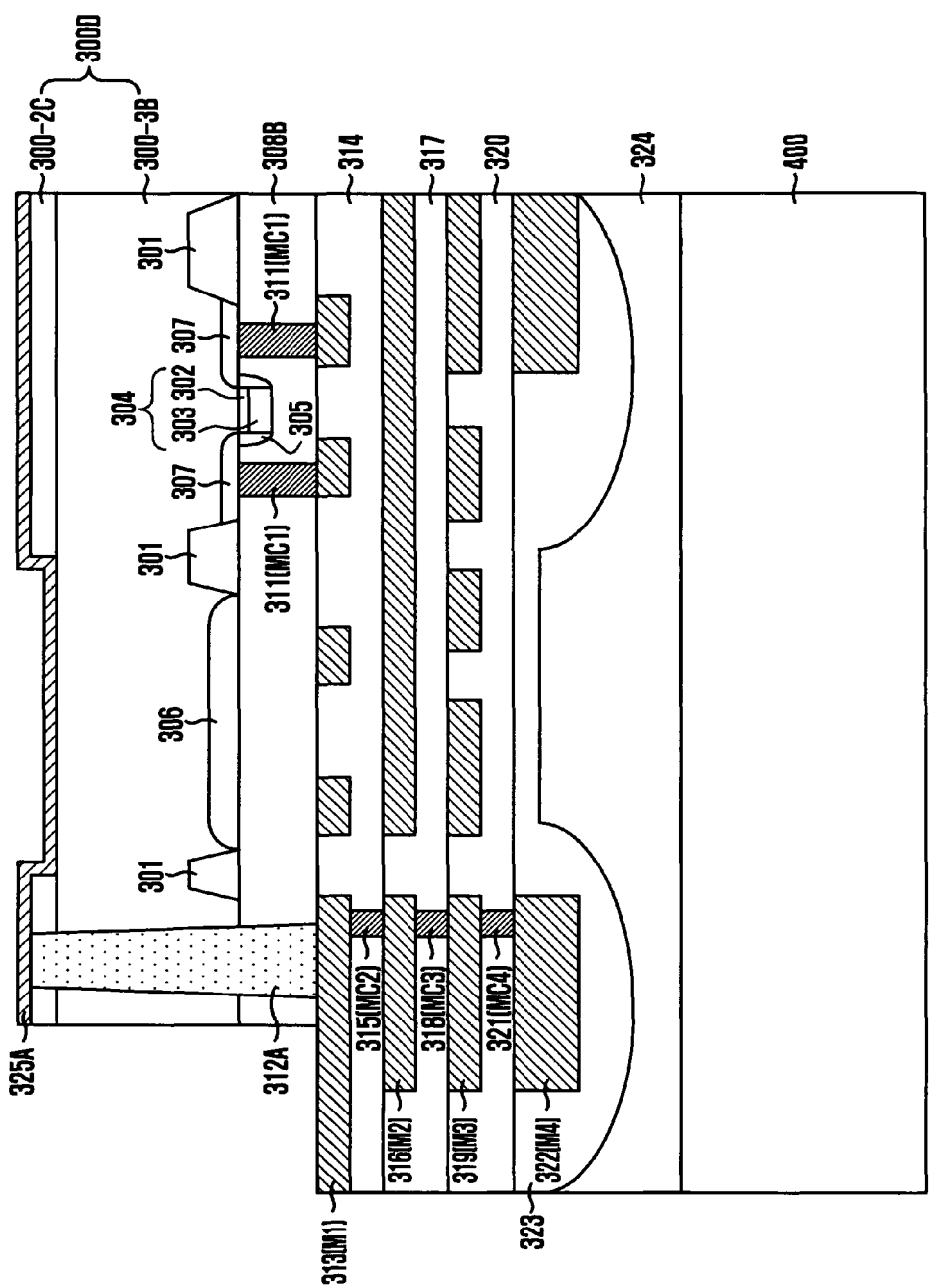

Referring to FIG. 4J, the light anti-scattering layer 325, the buried oxide pattern 300-2B, the second semiconductor pattern 300-3A, and the interlayer insulation pattern 308A are locally etched to locally expose the backside of the first interconnection layer 313. Therefore, the exposed first interconnection layer 313 can serve as a pad, which will be wire-bonded in a subsequent process. Hereinafter, the etched anti-scattering layer 325, remaining buried oxide pattern 300-2B, second semiconductor pattern 300-3A, and first interlayer insulation pattern 308A are called anti-scattering pattern 325A, final buried oxide pattern 300-2C, remaining second semiconductor pattern 300-3B, and remaining first interlayer insulation pattern 308B.

After exposing the backside of the first interconnection layer 313, conductive material for a separate pad may be formed on the exposed backside of the first interconnection layer 313. In this case, a metal or a mixture containing a metal may be used as the conductive material. Preferably, aluminum (Al) is used as the conductive material.

Figure 4K:
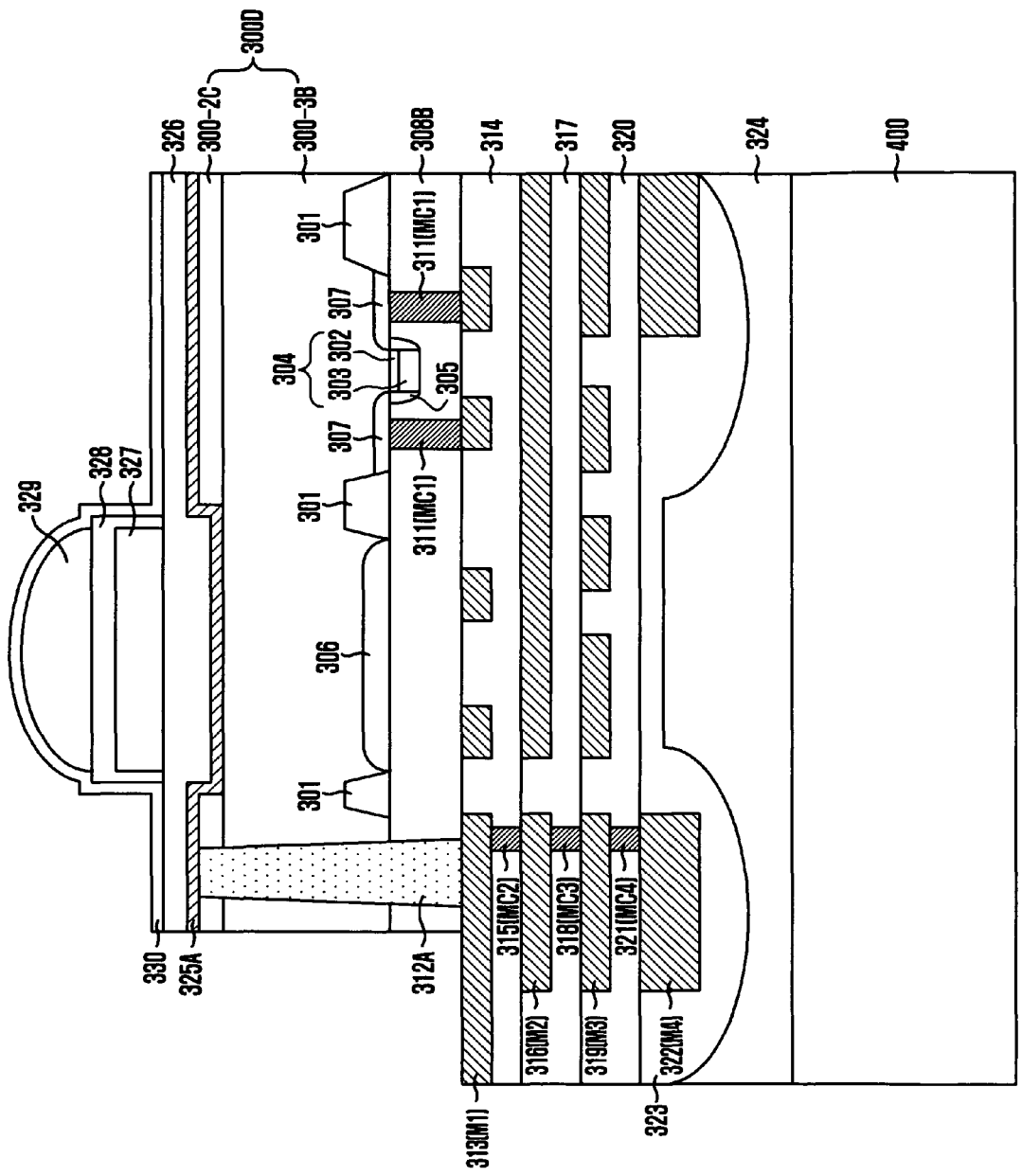

Referring to FIG. 4K, a passivation layer 326 may be formed over the light anti-scattering pattern 325A. The passivation layer 326 may be formed of an insulating material, for example, oxide.

A color filter 327 and a microlens 329 are sequentially formed over the passivation layer 326 overlapping the photodiode 306. A planarization layer 328 may be formed as an over coating layer (OCL) between the passivation layer 326 and the color filter 327 and between the color filter 327 and the microlens 329. The planarization layer 328 may be formed of an organic material.

A LTO layer 330 may be formed over the microlens 329, the light anti-scattering layer 325, and the passivation layer 326.

The first substrate 300D and the second substrate 400 are packaged by a packaging process. The packaging process includes a wire bonding process and a sawing process. The wire bonding is achieved by bonding the pad (interconnection layer) to an external chip through a wire.

The embodiments of the present invention can obtain the following effects.

First, compared with the typical CMOS image sensor (a front-side illuminated image sensor), the backside illuminated image sensor where light is illuminated from the backside of the substrate (wafer) can minimize loss of light incident onto the light receiving element, thereby increasing the light receiving efficiency.

Second, in the method for fabricating the backside illuminated image sensor using the back grinding process, the align key having a via hole shape is formed in the substrate before the back grinding process of grinding the backside of the substrate, and the backside grinding target of the substrate is controlled during the back grinding process. Therefore, the control of the back grinding process is facilitated.

Third, the top surface of the align key is connected to the interconnection layer formed on the front side of the substrate, and the backside of the align key is exposed and connected to the pad. Thus, the align key is used as the contact plug connecting the pad to the interconnection layer. Hence, the pad can be arranged on the backside of the substrate, not the front side of the substrate. Various designs are possible in the packaging process.

Fourth, the light anti-scattering layer is formed for preventing the scattering of light incident onto the backside of the substrate. Therefore, the light collecting efficiency of the photodiode can be increased to improve the light receiving efficiency.

While the present invention has been described with respect to the specific embodiments, it will be apparent to those skilled in the art that various changes and modifications may be made without departing from the spirit and scope of the invention as defined in the following claims.

What is claimed is:

1. An image sensor, comprising:
    a light-receiving element disposed in a substrate;
    an interlayer insulation layer disposed on a front side of the substrate;
    an align key spaced apart from the light-receiving element and configured to pass through the interlayer insulation layer and the substrate;
    a plurality of interconnection layers disposed on the interlayer insulation layer, wherein an interconnection layer from the plurality of interconnection layers is connected to the align key;
    a passivation layer disposed on the plurality of interconnection layers;
    a pad disposed on a back side of the substrate and connected to the align key;
    a light anti-scattering layer disposed on the back side of the substrate; and
    a color filter and a microlens disposed on the light anti-scattering layer.

2. The image sensor of claim 1, wherein the light anti-scattering layer has a multi-layered structure where materials having different refractive indexes are stacked.

3. The image sensor of claim 2, wherein the multi-layered structure of the light anti-scattering layer comprises a stacked layer of:
    an oxide layer and a nitride layer; or
    an oxide layer and a carbon-containing layer.

4. The image sensor of claim 3, wherein the oxide layer comprises one layer selected from the group consisting of a borophosphosilicate glass (BPSG) layer, a phosphosilicate glass (PSG) layer, a borosilicate glass (BSG), an un-doped silicate glass (USG) layer, a tetra ethyl ortho silicate (TEOS) layer, and a high density plasma (HDP) layer.

5. The image sensor of claim 3, wherein the nitride layer comprises a silicon nitride layer or a silicon oxynitride layer.

6. The image sensor of claim 3, wherein the nitride layer comprises an N—H rich nitride layer having more N—H bonds than $Si_3N_4$.

7. The image sensor of claim 3, wherein the carbon-containing layer comprises a SiC layer.

8. The image sensor of claim 3, wherein the oxide layer is formed to a thickness of approximately 1,000 Å to approximately 10,000 Å.

9. The image sensor of claim 3, wherein the nitride layer or the carbon-containing layer is formed to a thickness of approximately 100 Å to approximately 5,000 Å.

10. The image sensor of claim 1, wherein the align key is formed of a conductive material.

11. The image sensor of claim 10, further comprising a barrier layer enclosing an outer wall of the align key.

12. The image sensor of claim 1, further comprising another substrate bonded to the passivation layer.

13. An image sensor, comprising:
    a light-receiving element formed in a front side of a substrate;
    an interlayer insulation layer disposed on the front side of the substrate;
    an align key spaced apart from the light-receiving element and configured to pass through the interlayer insulation layer and the substrate;
    a plurality of interconnection layers disposed on the interlayer insulation layer; and
    a microlens disposed on the back side of the substrate and configured to direct light toward the light-receiving element.

14. The image sensor of claim 13, further comprising a pad disposed on a back side of the substrate and connected to the align key.

15. The image sensor of claim 14, wherein the align key is formed of a conductive material and connects the pad to at least one interconnection layer from the plurality of interconnection layers.

16. The image sensor of claim 15, further comprising additional align keys that pass through the interlayer insulation layer and that further connect the pad to the plurality of interconnection layers.

17. The image sensor of claim 13, further comprising a pad disposed on an exposed back side of the plurality of interconnection layers.

18. The image sensor of claim 13, wherein the align key is formed of an insulating material.

19. The image sensor of claim 13, further comprising a barrier layer enclosing an outer wall of the align key.

20. The image sensor of claim 13, wherein the substrate comprises:
   source regions and drain regions formed in the substrate; and
   contact plugs that pass through the interlayer insulation layer and connect the source regions and drain regions to the plurality of interconnection layers.

21. The image sensor of claim 13, further comprising another substrate bonded to the front side of the substrate, wherein the other substrate includes circuitry configured to process image signals from the substrate.

22. An image sensor, comprising:
   a first substrate comprising a front side and a back side;
   a light-receiving element disposed in the front side of the first substrate;
   a microlens formed on the back side of the first substrate and configured to direct light toward the light-receiving element;
   a second substrate bonded to the front side of the first substrate, wherein the second substrate comprises circuitry configured to process image signals generated by the light-receiving element;
   a plurality of interconnection layers formed between the first substrate and the second substrate; and
   a pad disposed on the back side of the first substrate and connected to the plurality of interconnection layers via an align key that passes through the first substrate.

* * * * *